United States Patent
Kato et al.

(10) Patent No.: US 10,476,147 B2
(45) Date of Patent: Nov. 12, 2019

(54) ANTENNA DEVICE AND METHOD OF MANUFACTURING THE SAME

(71) Applicant: Murata Manufacturing Co., Ltd., Nagaokakyo-shi, Kyoto-fu (JP)

(72) Inventors: Noboru Kato, Nagaokakyo (JP); Makoto Yasutake, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 179 days.

(21) Appl. No.: 15/614,816

(22) Filed: Jun. 6, 2017

(65) Prior Publication Data

US 2017/0271757 A1 Sep. 21, 2017

Related U.S. Application Data

(63) Continuation of application No. PCT/JP2016/050179, filed on Jan. 6, 2016.

(30) Foreign Application Priority Data

Jan. 15, 2015 (JP) .................. 2015-006007

(51) Int. Cl.
*H01Q 1/38* (2006.01)
*G06K 19/07* (2006.01)
(Continued)

(52) U.S. Cl.
CPC ............... *H01Q 1/38* (2013.01); *G06K 19/07* (2013.01); *G06K 19/077* (2013.01);
(Continued)

(58) Field of Classification Search
CPC .. H01Q 1/38; H01Q 5/48; H01Q 7/00; H01Q 1/2225; H01Q 7/005; G06K 19/07; G11C 11/2273

See application file for complete search history.

(56) References Cited

U.S. PATENT DOCUMENTS 7,417,599 B2 * 8/2008 Goff ...................... B82Y 20/00 343/867
8,847,831 B2 9/2014 Kato et al.
(Continued)

FOREIGN PATENT DOCUMENTS

JP 2003-332820 A 11/2003
JP 4788850 B2 10/2011
(Continued)

OTHER PUBLICATIONS

International Search Report issued in International Application No. PCT/JP2016/050179, dated Mar. 15, 2016.
(Continued)

*Primary Examiner* — Dameon E Levi
*Assistant Examiner* — David E Lotter
(74) *Attorney, Agent, or Firm* — Arent Fox LLP

(57) ABSTRACT

An antenna device includes an RFIC element, a power supply coil connected to the RFIC element, and a first coil conductor including a first large-diameter loop shaped conductor and a first small-diameter loop shaped conductor. The first coil conductor functions as a booster antenna and forms an antenna resonance circuit. The power supply coil is accommodated in a recess surrounded by the first small-diameter loop shaped conductor. The power supply coil is disposed in a manner that its winding direction is aligned with the winding axis direction of the first small-diameter loop shaped conductor and its outer diameter is inside a coil opening of the first small-diameter loop shaped conductor in a planar view. The power supply coil is coupled to the first small-diameter loop shaped conductor through a magnetic field.

20 Claims, 19 Drawing Sheets

(51) Int. Cl.
  *G06K 19/077* (2006.01)
  *H01Q 7/00* (2006.01)
  *H01Q 5/48* (2015.01)
  *G11C 11/22* (2006.01)
  *H01Q 1/22* (2006.01)

(52) U.S. Cl.
  CPC ....... *G11C 11/2273* (2013.01); *H01Q 1/2225* (2013.01); *H01Q 5/48* (2015.01); *H01Q 7/00* (2013.01); *H01Q 7/005* (2013.01)

(56) References Cited

U.S. PATENT DOCUMENTS

| | | |
|---|---|---|
| 8,847,844 B2 | 9/2014 | Kato et al. |
| 9,104,950 B2 | 8/2015 | Kato et al. |
| 2004/0183742 A1* | 9/2004 | Goff ................ B82Y 20/00 343/867 |
| 2005/0186902 A1* | 8/2005 | Lieffort ............ G06K 7/10178 455/41.1 |
| 2011/0279340 A1* | 11/2011 | Kato ................ G06K 19/07749 343/793 |
| 2012/0092222 A1 | 4/2012 | Kato et al. |
| 2012/0098728 A1 | 4/2012 | Kato et al. |
| 2012/0098729 A1 | 4/2012 | Kato et al. |
| 2013/0112754 A1* | 5/2013 | Ikemoto ............ G06K 7/10336 235/488 |

FOREIGN PATENT DOCUMENTS

| | | |
|---|---|---|
| JP | 2012-161062 A | 8/2012 |
| WO | 2010/087429 A1 | 8/2010 |

OTHER PUBLICATIONS

Written Opinion of the International Searching Authority issued in International Application No. PCT/JP2016/050179, dated Mar. 15, 2016.

* cited by examiner

ANTENNA DEVICE AND METHOD OF MANUFACTURING THE SAME

CROSS REFERENCE TO RELATED APPLICATIONS

The present application is a continuation of PCT/JP2016/050179 filed Jan. 6, 2016, which claims priority to Japanese Patent Application No. 2015-006007, filed Jan. 15, 2015, the entire contents of each of which are incorporated herein by reference.

TECHNICAL FIELD

The present disclosure relates to an antenna device for RFID communication and the like, and a method of manufacturing the antenna device.

BACKGROUND

Proximity communication systems using various non-contact ICs have been currently employed in a wide range of fields. In such communication systems, for example, a non-contact IC card or a non-contact IC tag comes close to a card reader within a predetermined distance to perform near-field radio communication. There have been devised non-contact IC cards or non-contact IC tags including a module in which a wireless communication IC functioning as a data carrier is integrated with an antenna.

For example, JP 4788850 B2 and WO 2010/087429 describe an antenna module that includes an electromagnetic coupling module having a wireless communication IC and a power supply coil connected to the wireless communication IC, and an antenna that has a first coil electrode wound along a first principal surface of an insulating base and a second coil electrode wound along a second principal surface opposing the first principal surface. In the antenna, openings of the first coil electrode and the second coil electrode can be made larger than an opening of the power supply coil of the electromagnetic coupling module. This increases the magnetic flux linking an antenna coil of a communication target. In other words, the antenna functions as not only an antenna resonance circuit but also a booster antenna for the electromagnetic coupling module.

The degree of coupling of the booster antenna and the power supply coil of the electromagnetic coupling module (i.e., an RFIC module) influences the amount of magnetic field energy received by the wireless communication IC via the booster antenna and thus is preferably as high as possible. A higher degree of coupling allows for a longer communication distance in the communication systems. To increase the degree of coupling, the antenna modules described in JP 4788850 B2 and WO 2010/087429 increase the number of windings of a coupling part of the booster antenna performing electromagnetic field coupling to the power supply coil of the electromagnetic coupling module. Additionally, the electromagnetic coupling module is mounted on the booster antenna so that the power supply coil of the electromagnetic coupling module overlaps the coupling part.

The resonance frequencies of a booster antenna and an RFIC module (an RFIC element and a power supply coil connected to the RFIC element) are set as the communication frequency. Unfortunately, if the mounting position of the electromagnetic coupling module (the RFIC module) is shifted relative to the coupling part of the booster antenna in the structures described in JP 4788850 B2 and WO 2010/087429, the capacity between, or the degree of coupling of, the coupling part of the booster antenna and the power supply coil may change. The resonance frequency is set by the inductance (the inductive reactance) and the capacity (the capacitive reactance) of a circuit. When the capacity between, or the degree of coupling of, the coupling part of the booster antenna and the power supply coil changes, the resonance frequencies of the booster antenna and the RFIC module may also change. These resonance frequencies deviate from the communication frequency for communication and thus the degree of coupling to an antenna coil of a communication target decreases, reducing a communication distance in communication systems.

The electromagnetic coupling module (the RFIC module) is mounted on an insulating base in the structures described in JP 4788850 B2 and WO 2010/087429, and thus the thickness of an antenna module increases. A cavity may be formed in the insulating base and the electromagnetic coupling module may be accommodated in the cavity. However, this complicates the structure of the antenna module and requires a step of forming the cavity in the insulating base, so that a manufacturing process is also complicated.

SUMMARY

As disclosed herein, an antenna device is provided that can reduce a variation in the degree of coupling of an antenna coil and a power supply coil due to a positional shift of the power supply coil relative to the antenna coil to stabilize a communicable distance and that can be made thin.

Thus, in one aspect, an antenna device is provided that includes an RFIC element, a power supply coil connected to the RFIC element, and a first coil conductor including a first large-diameter loop shaped conductor and a first small-diameter loop shaped conductor connected to a first end of the first large-diameter loop shaped conductor. The power supply coil is disposed in a manner that its winding direction is aligned with a winding axis direction of the first small-diameter loop shaped conductor and its outer diameter is inside a coil opening of the first small-diameter loop shaped conductor in a planar view to be coupled to the first small-diameter loop shaped conductor through a magnetic field.

In such a structure, the power supply coil is disposed in a manner that its winding direction is preferably aligned with the winding axis direction of the first small-diameter loop shaped conductor and its outer diameter is inside the coil opening of the first small-diameter loop shaped conductor. That is, the power supply coil is accommodated in a recess surrounded by the first small-diameter loop shaped conductor. Even if the mounting position of the power supply coil is shifted, it is possible to prevent a significant change in the degree of coupling and to reduce a variation in mutual inductance due to the significant change in the degree of coupling. Consequently, a change in the degree of coupling due to the mounting position of the power supply coil relative to the first coil conductor, that is, an antenna coil is small. Therefore, it is possible to reduce variations in the resonance frequency of the first coil conductor functioning as a booster antenna and in the resonance frequency of the power supply coil, achieving a stable communicable distance.

The power supply coil is disposed in the recess surrounded by the first small-diameter loop shaped conductor in the structure described above. It is thus possible to obtain a thinner antenna device than an antenna device having the power supply coil mounted on a surface of the booster antenna.

In an exemplary aspect, the antenna device preferably further includes a second coil conductor including a second large-diameter loop shaped conductor disposed to oppose the first large-diameter loop shaped conductor and a second small-diameter loop shaped conductor disposed to oppose the first small-diameter loop shaped conductor and connected to a first end of the second large-diameter loop shaped conductor. The first coil conductor and the second coil conductor preferably form an antenna resonance circuit including inductance components of the first coil conductor and the second coil conductor and a capacitive component between the first coil conductor and the second coil conductor. The first coil conductor and the second coil conductor function as a booster antenna for the power supply coil in the structure. In the first coil conductor and the second coil conductor, the inductance components of the first coil conductor and the second coil conductor and the capacitive component between the first coil conductor and the second coil conductor form the antenna resonance circuit. This eliminates a capacitance element for a resonance circuit and thus the antenna device is easily manufactured at a low cost.

In an exemplary aspect, the antenna device preferably further includes a base layer. The first coil conductor is preferably a thin metal plate adhered to the base layer, and the second coil conductor is preferably a thin metal plate adhered to the first coil conductor with an insulating adhesive layer interposed between the first coil conductor and the second coil conductor. This structure enables the booster antenna (the antenna resonance circuit) to be formed more easily than a case where the first coil conductor and the second coil conductor are patterned by etching an Al foil. Additionally, it is possible to obtain a thinner antenna device than an antenna device in which the first coil conductor and the second coil conductor are respectively formed on both principal surfaces of the base layer to form the booster antenna (i.e., the antenna resonance circuit).

In an exemplary aspect, the number of windings of the first small-diameter loop shaped conductor is substantially 1 and the first small-diameter loop shaped conductor is disposed in an area where the first large-diameter loop shaped conductor is formed in a planar view. It is preferable that the number of windings of the second small-diameter loop shaped conductor is substantially 1 and the second small-diameter loop shaped conductor is disposed in an area where the second large-diameter loop shaped conductor is formed in a planar view. This structure allows for a small mutual inductance M between the first small-diameter loop shaped conductor and the second small-diameter loop shaped conductor, and the power supply coil. Even if the mounting position of the power supply coil is shifted relative to the first small-diameter loop shaped conductor and the second small-diameter loop shaped conductor, it is possible to reduce a variation in the mutual inductance M. Consequently, it is possible to reduce variations in the resonance frequency of the booster antenna (the antenna resonance circuit) and in the resonance frequency of an RFIC module. In this structure, it is possible to form the coil opening of the booster antenna (the antenna resonance circuit) to be large relative to the base layer, and thus more magnetic flux can link an antenna coil of a communication target. That is, it is possible to increase the degree of coupling to the antenna coil of the communication target.

In an exemplary aspect, the number of windings of the first large-diameter loop shaped conductor is substantially 1 and the number of windings of the second large-diameter loop shaped conductor is substantially 1. The numbers of windings of the first large-diameter loop shaped conductor and the second large-diameter loop shaped conductor are small, and thus it is possible to form the width of the first large-diameter loop shaped conductor and the second large-diameter loop shaped conductor to be large, while the effective coil opening of the booster antenna is kept large. Even if the positions where the first large-diameter loop shaped conductor and the second large-diameter loop shaped conductor that are disposed to oppose to each other are formed are shifted, it is possible to reduce a variation in capacity (capacitance) between the first large-diameter loop shaped conductor and the second large-diameter loop shaped conductor. Consequently, it is possible to reduce a variation in the resonance frequency of the booster antenna (the antenna resonance circuit) formed by the first coil conductor and the second coil conductor. Further, the first large-diameter loop shaped conductor and the second large-diameter loop shaped conductor have a small resistance component, and thus it is possible to obtain a booster antenna having a high Q value.

In an exemplary aspect, the first small-diameter loop shaped conductor of the antenna device is preferably wound in the same winding direction as the first large-diameter loop shaped conductor in a planar view and that the second small-diameter loop shaped conductor is preferably wound in the same winding direction as the second large-diameter loop shaped conductor in a planar view. In this structure, the direction of currents flowing in the first small-diameter loop shaped conductor and in the second small-diameter loop shaped conductor is aligned with the direction of currents flowing in the first large-diameter loop shaped conductor and in the second large-diameter loop shaped conductor. A magnetic field generated in the first large-diameter loop shaped conductor and the second large-diameter loop shaped conductor is not cancelled out by a magnetic field generated in the first small-diameter loop shaped conductor and the second small-diameter loop shaped conductor. Consequently, the area of the effective coil opening of the booster antenna can be kept large and the degree of coupling to the antenna coil of the communication target can be increased, so that a communication distance can be increased.

In an exemplary aspect, the RFIC element and the power supply coil are preferably incorporated in one chip forming an RFIC module. With this structure, it is possible to easily form an antenna device only by disposing the RFIC module inside the coil opening of the first small-diameter loop shaped conductor and the coil opening of the second small-diameter loop shaped conductor.

In an exemplary aspect, the RFIC module preferably includes a laminate formed by laminating a plurality of base material layers. Further, it is preferable that the power supply coil is formed in an interior of the laminate and the RFIC element is formed on a surface of the laminate or in the interior of the laminate. This structure enables the number of windings of the power supply coil to be changed easily, thus achieving a desired inductance value.

In an exemplary aspect, the first coil conductor preferably includes a first intermediate coil conductor. Further, it is preferable that the first small-diameter loop shaped conductor is connected via the first intermediate coil conductor to the first end of the first large-diameter loop shaped conductor. According to this aspect, the number of windings of the first large-diameter loop shaped conductor is small and thus the inductance component of the first coil conductor forming the antenna resonance circuit tends to be insufficient. However, this structure enables an inductance component required for the antenna resonance circuit to be obtained easily.

In an exemplary aspect, the first intermediate coil conductor preferably has a smaller width than the first large-diameter loop shaped conductor and the first small-diameter loop shaped conductor. With this structure, it is possible to easily form the first intermediate coil conductor whose number of windings is sufficient for obtaining a desired inductance component in the limited space.

In an exemplary aspect, the second coil conductor preferably includes a second intermediate coil conductor. Further, it is preferable that the second small-diameter loop shaped conductor is connected via the second intermediate coil conductor to the first end of the second large-diameter loop shaped conductor. According to this aspect, the number of windings of the second large-diameter loop shaped conductor is small and thus the inductance component of the second coil conductor forming the antenna resonance circuit tends to be insufficient. However, this structure enables an inductance component required for the antenna resonance circuit to be obtained easily.

In an exemplary aspect, the second intermediate coil conductor preferably has a smaller width than the second large-diameter loop shaped conductor and the second small-diameter loop shaped conductor. With this structure, it is possible to easily form the second intermediate coil conductor whose number of windings is sufficient for obtaining a desired inductance component in the limited space.

Moreover, in one aspect a method of manufacturing an antenna device is disclosed that includes forming a first coil conductor on a base layer, the first coil conductor including a first large-diameter loop shaped conductor and a first small-diameter loop shaped conductor connected to a first end of the first large-diameter loop shaped conductor, punching a thin metal plate to form a second coil conductor including a second large-diameter loop shaped conductor and a second small-diameter loop shaped conductor connected to a first end of the second large-diameter loop shaped conductor, adhering the second coil conductor to the first coil conductor with an insulating adhesive layer interposed between the first coil conductor and the second coil conductor in a manner that the first large-diameter loop shaped conductor opposes the second large-diameter loop shaped conductor and the first small-diameter loop shaped conductor opposes the second small-diameter loop shaped conductor, and disposing a power supply coil connected to an RFIC element on the base layer inside an opening of the first small-diameter loop shaped conductor and a coil opening of the second small-diameter loop shaped conductor.

With the manufacturing method described above, it is possible to easily manufacture an antenna device that can reduce variations in the resonance frequency of the booster antenna and in the resonance frequency of the resonance circuit formed by the RFIC element and the power supply coil if the mounting position of the power supply coil is shifted, and that can be made thin.

The disclosed antenna device and manufacturing method achieves the antenna device that can reduce a variation in the degree of coupling of the antenna coil and the power supply coil due to a positional shift of the power supply coil relative to the antenna coil to stabilize a communicable distance and that can be made thin.

DETAILED DESCRIPTION

Figure 1:
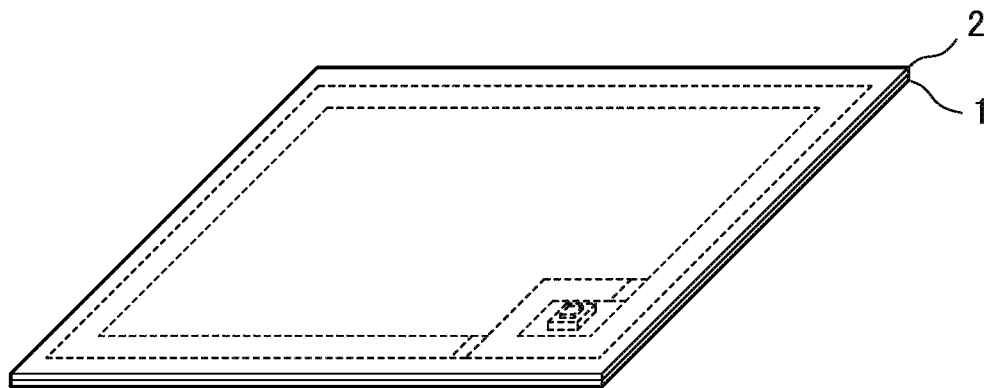
FIG. 1 is an external perspective view of an antenna device 101 according to a first embodiment.

A plurality of embodiments are described below using several specific examples with reference to the drawings. In the drawings, the same reference signs denote the same parts. The embodiments are illustrative and partial replacements or combinations of structures described in different embodiments can be made.

First Embodiment

Figure 2:
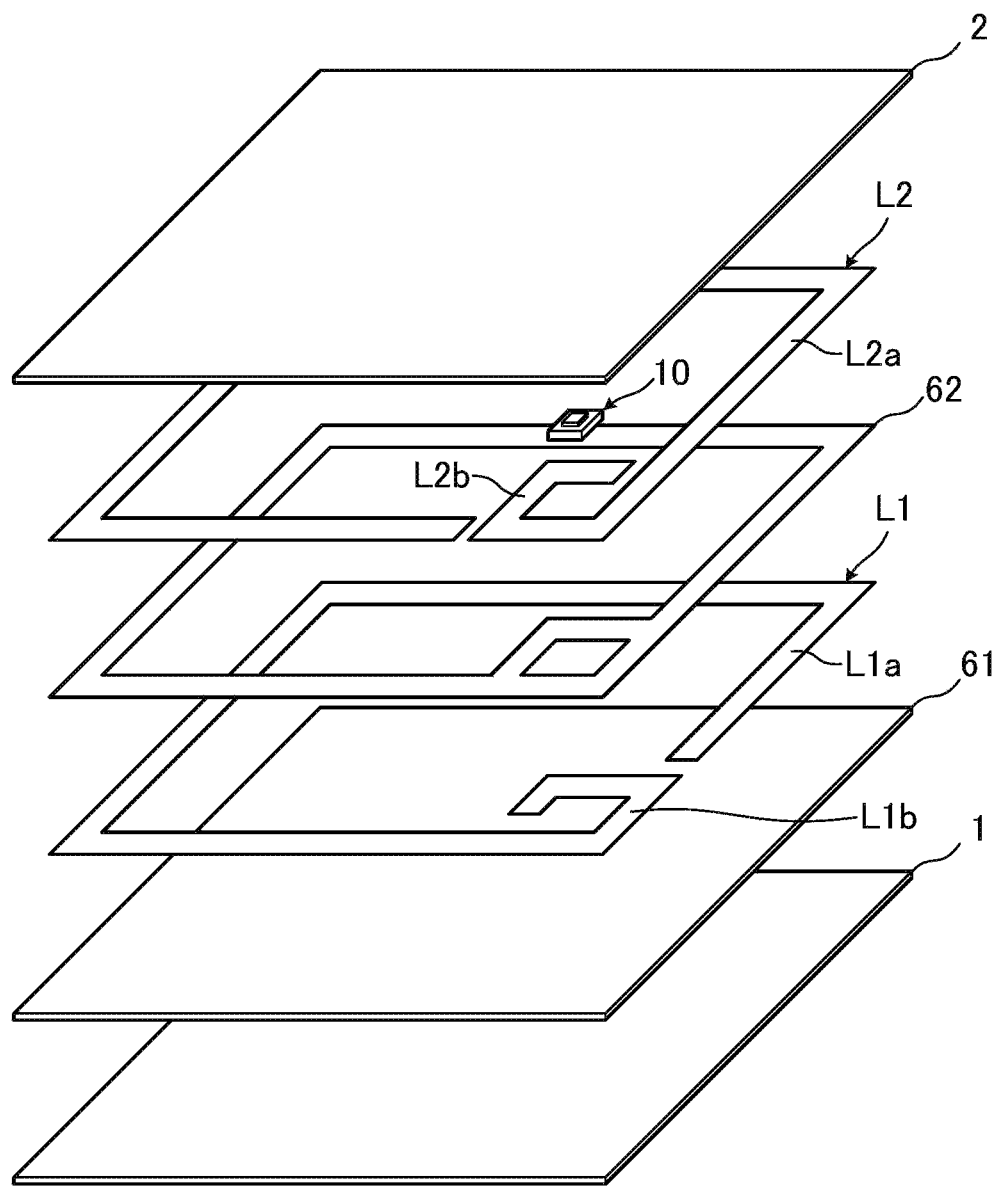
FIG. 2 is an exploded perspective view of the antenna device 101.
Figure 3A:
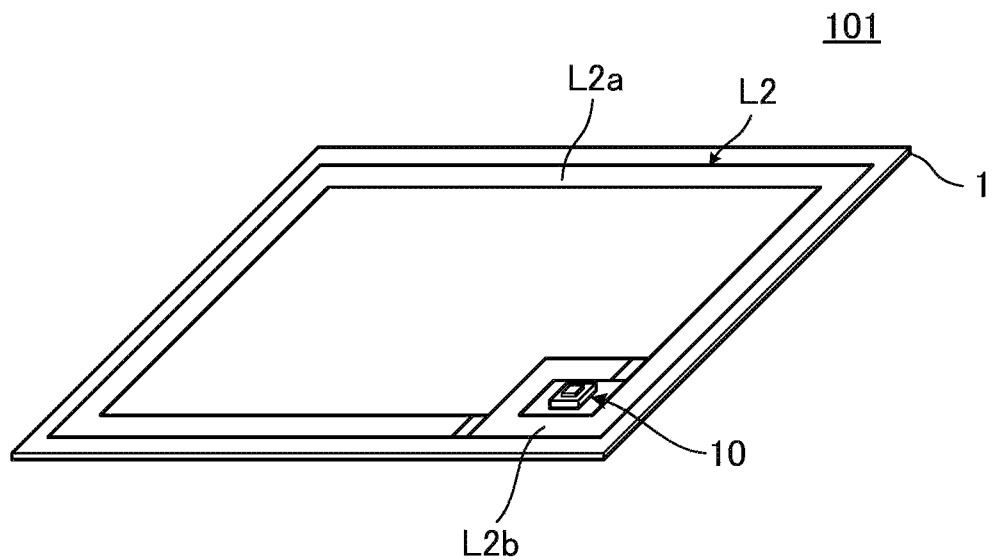
FIG. 3A is an external perspective view of the antenna device 101 with a protection layer 2, adhesive layers 61 and 62, and a sealing layer 63 omitted therefrom.
Figure 3B:
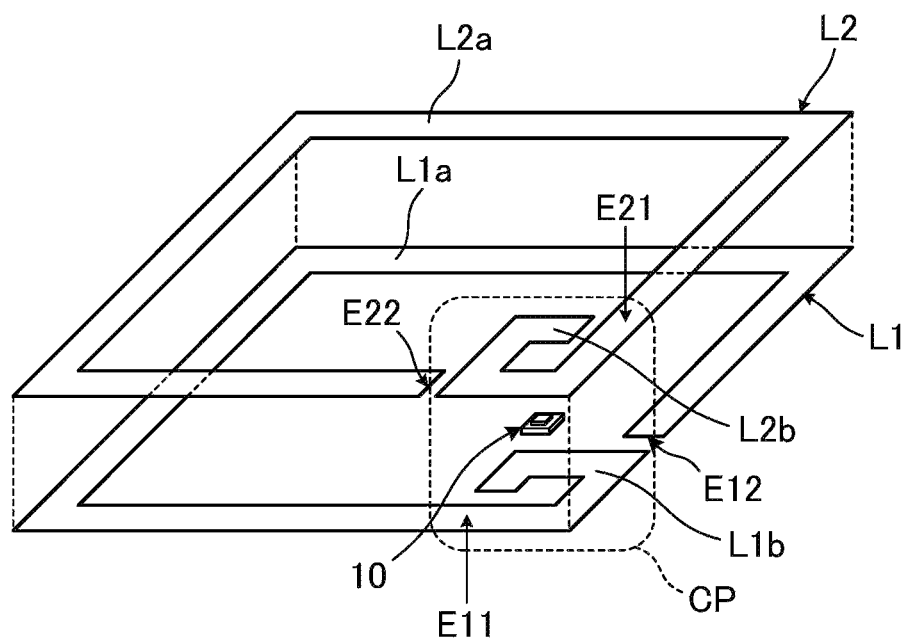
FIG. 3B is an exploded perspective view of a coil conductor and an RFIC module of the antenna device 101.
Figure 4:
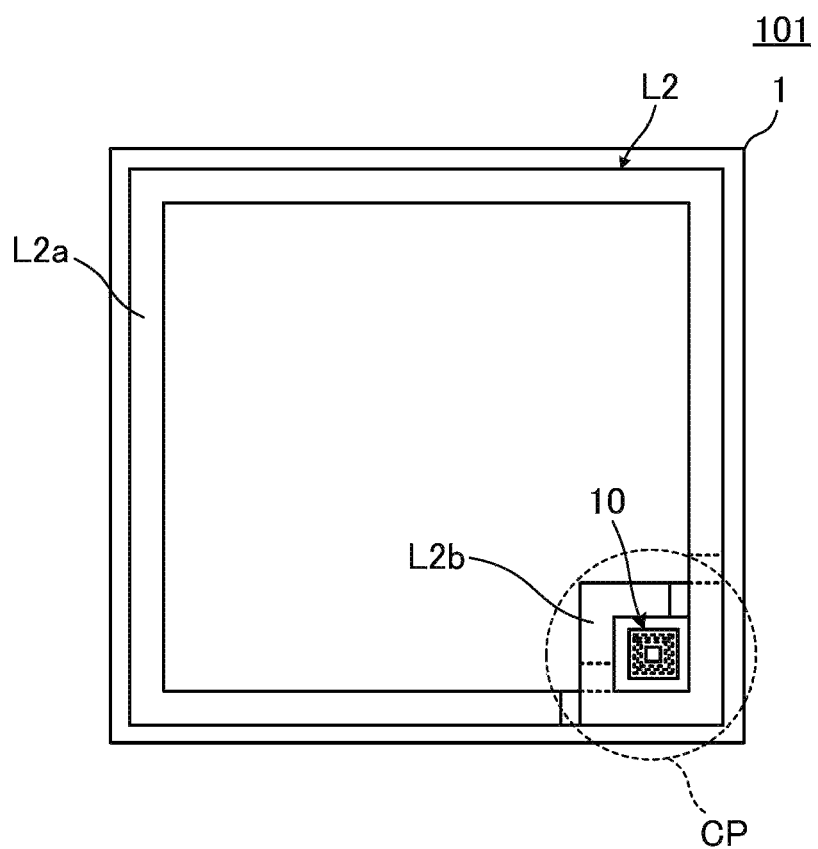
FIG. 4 is a plan view of the antenna device 101 according to the first embodiment.

An antenna device according to a first embodiment is described with reference to the drawings. FIG. 1 is an external perspective view of an antenna device 101 according to the first embodiment. FIG. 2 is an exploded perspective view of the antenna device 101. A sealing layer (shown later) is omitted in FIG. 2. FIG. 3A is an external perspective view of the antenna device 101 with a protection layer 2, adhesive layers 61 and 62, and the sealing layer omitted therefrom. FIG. 3B is an exploded perspective view of a coil conductor and an RFIC module of the antenna device 101. FIG. 4 is a plan view of the antenna device 101 according to the first embodiment. The protection layer 2 and the sealing layer are omitted in FIG. 4.

As shown, the antenna device 101 includes a base layer 1, an RFIC module 10, the protection layer 2, a first coil conductor L1, a second coil conductor L2, the adhesive layers 61 and 62, and the sealing layer. The antenna device 101 is a card-size RFID tag (an IC card) with its HF band being a carrier frequency band.

The base layer 1 is a rectangular plate made of an insulating material such as a resin. While the base layer 1 is, for example, a PET (polyethylene-terephthalate) sheet, the base layer 1 may be coated paper. The adhesive layer 61 has insulation and adhesion properties and is formed on the substantially entire surface of the base layer 1. While the adhesive layer 61 is, for example, a double-sided adhesive sheet, the adhesive layer 61 may be a layer formed of an adhesive. While the present embodiment describes an example in which the adhesive layer 61 is formed on the substantially entire surface of the base layer 1, the present disclosure is not limited to this example. The shape of the adhesive layer 61 may be changed appropriately.

The RFIC module 10 includes an RFIC element 40, a laminate 20 formed by laminating a plurality of base layers, and a power supply coil 30. The power supply coil 30 is formed in the interior of the laminate 20 and connected to the RFIC element 40. The RFIC module 10 is disposed in a manner that a surface of the RFIC module 10 on the side of the laminate 20 is disposed on (e.g., adhered to) a principal surface of the base layer 1 through the adhesive layer 61, functioning as a resonance circuit formed by the RFIC element 40 and the power supply coil 30. In the RFIC module 10 according to the present embodiment, the RFIC element 40 and the power supply coil 30 are incorporated in one chip.

The first coil conductor L1 is a thin metal plate disposed on (e.g., adhered to) the principal surface of the base layer 1 through the adhesive layer 61, and includes a first large-diameter loop shaped conductor L1a and a first small-diameter loop shaped conductor L1b. The second coil conductor L2 is a thin metal plate disposed on (e.g., adhered to) the first coil conductor L1 through the insulating adhesive layer 62, and includes a second large-diameter loop shaped conductor L2a and a second small-diameter loop shaped conductor L2b. The first coil conductor L1 and the second coil conductor L2 are, for example, Al foils. The adhesive layer 62 has insulation and adhesion properties, and is formed in the substantially same shape as the first coil conductor L1 and the second coil conductor L2. While the adhesive layer 62 is, for example, a double-sided adhesive sheet, the adhesive layer 62 may be a layer formed of an adhesive. While the present embodiment describes an example in which the adhesive layer 62 is formed in the substantially same shape as the first coil conductor L1 and the second coil conductor L2, the present embodiment is not limited to this example. Accordingly, the shape of the adhesive layer 62 may be changed appropriately.

The protection layer 2 is a rectangular plate. The protection layer 2 has substantially the same shape as the base layer 1 and stacked on the base layer 1 with the RFIC module 10, the first coil conductor L1, the second coil conductor L2, the adhesive layers 61 and 62, and the sealing layer interposed therebetween. While the present embodiment describes an example in which the protection layer 2 has substantially the same shape as the base layer 1, the present disclosure is not limited to this example. The shape of the protection layer 2 may be changed appropriately.

While the protection layer 2 is, for example, a PET sheet, the protection layer 2 may be coated paper. The protection layer 2 protects the sealing layer, the RFIC module 10, the first coil conductor L1, the second coil conductor L2, and the like from externally applied impact or external force.

Figure 5A:
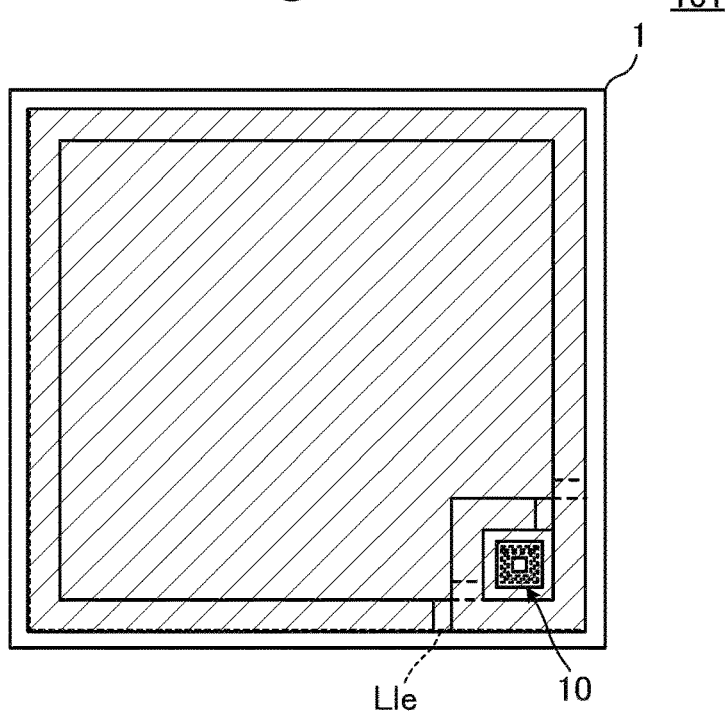
FIG. 5A is a plan view of an area where a first large-diameter loop shaped conductor and a second large-diameter loop shaped conductor are formed.
Figure 5B:
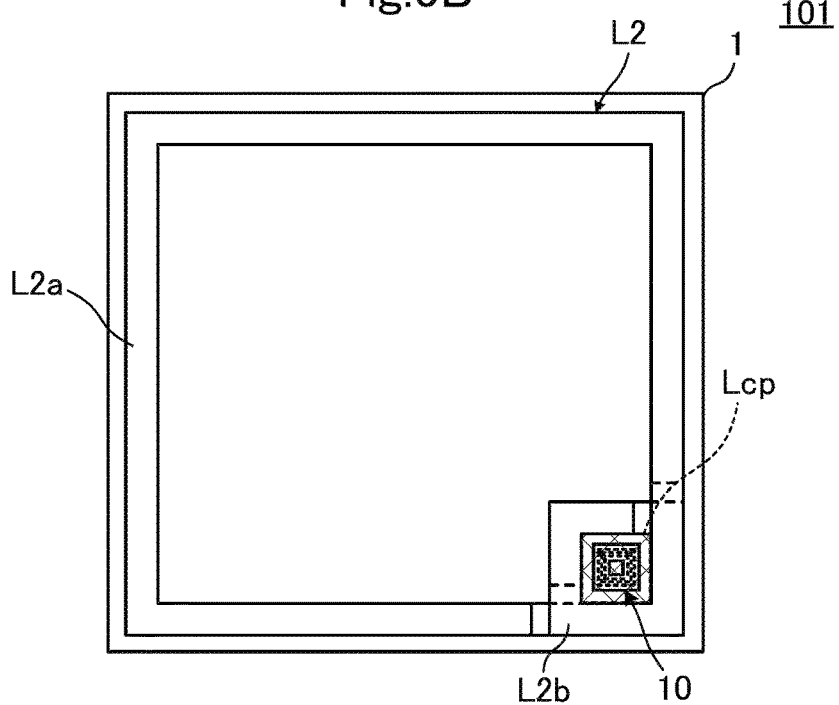
FIG. 5B shows coil openings of the first small-diameter loop shaped conductor and the second small-diameter loop shaped conductor.

FIG. 5A is a plan view of an area where a first large-diameter loop shaped conductor and a second large-diameter loop shaped conductor are formed, and FIG. 5B shows coil openings of the first small-diameter loop shaped conductor and the second small-diameter loop shaped conductor.

A large-diameter loop shaped conductor formation area L1e shown in FIG. 5A is an area where the first large-diameter loop shaped conductor and the second large-diameter loop shaped conductor are formed in a planar view. The inside Lcp of a coil opening of the small-diameter loop shaped conductor shown in FIG. 5B is "inside of a coil opening of a first small-diameter loop shaped conductor" according to the present disclosure, i.e., it is within the coil opening as shown.

The first large-diameter loop shaped conductor L1a is a thin metal plate that is formed in a loop shaped shape along the peripheral edge of the base layer 1, and a first end E11 of the first large-diameter loop shaped conductor L1a is connected to the first small-diameter loop shaped conductor L1b. As shown in FIG. 3B, the first large-diameter loop shaped conductor L1a winds counterclockwise from a second end E12 of the first large-diameter loop shaped conductor L1a to the first end E11 to substantially circle around the outer periphery of the base layer 1, and thus the number of windings is substantially 1.

The first small-diameter loop shaped conductor L1b is a loop shaped thin metal plate having smaller inner and outer diameters than a loop shaped thin metal plate of the first large-diameter loop shaped conductor L1a, and is formed to extend from the first large-diameter loop shaped conductor L1a. The first small-diameter loop shaped conductor L1b is disposed at a corner (a lower right corner in FIG. 4) of the rectangular base layer 1. In other words, the first small-diameter loop shaped conductor L1b is disposed in the area L1e where the first large-diameter loop shaped conductor L1a substantially circling around the outer periphery of the base layer 1 is formed. As shown in FIG. 3B, the first small-diameter loop shaped conductor L1b winds counterclockwise from the first end E11 of the first large-diameter loop shaped conductor L1a to substantially make a circle. Consequently, the first small-diameter loop shaped conductor L1b winds in the same direction as the winding direction of the first large-diameter loop shaped conductor L1a in a planar view, and the number of windings is substantially 1.

The second large-diameter loop shaped conductor L2a is a thin metal plate that is formed in a loop shaped shape along the peripheral edge of the base layer 1 and a first end E21 of the second large-diameter loop shaped conductor L2a is connected to the second small-diameter loop shaped conductor L2b. As shown in FIG. 3B, the second large-diameter loop shaped conductor L2a winds clockwise from a second end E22 of the second large-diameter loop shaped conductor L2a to the first end E21. Consequently, the second large-diameter loop shaped conductor L2a winds in the opposite direction to the winding direction of the first large-diameter loop shaped conductor L1a in a planar view. The second large-diameter loop shaped conductor L2a circles around the outer periphery of the base layer 1 and thus the number of windings is substantially 1.

The second small-diameter loop shaped conductor L2b is a loop shaped thin metal plate having smaller inner and outer diameters than a loop shaped thin metal plate of the second large-diameter loop shaped conductor L2a, and is formed to extend from the second large-diameter loop shaped conductor L2a. The second small-diameter loop shaped conductor L2b is disposed at a corner (a lower right corner in FIG. 4) of the rectangular base layer 1. In other words, the second small-diameter loop shaped conductor L2b is disposed in the area L1e where the second large-diameter loop shaped conductor L2a substantially circling around the outer periphery of the base layer 1 is formed. As shown in FIG. 3B, the second small-diameter loop shaped conductor L2b winds clockwise from the first end E21 of the second large-diameter loop shaped conductor L2a to substantially make a circle. Consequently, in this aspect, the second small-diameter loop shaped conductor L2b winds in the same direction as the winding direction of the second large-diameter loop shaped conductor L2a in a planar view, and the number of windings is substantially 1.

As described later, these first large-diameter loop shaped conductor L1a and second large-diameter loop shaped conductor L2a function as an antenna unit of a booster antenna (an antenna resonance circuit) to contribute to communication with an antenna coil of a communication target mainly through a magnetic field during operation.

The power supply coil 30 is coupled to the first small-diameter loop shaped conductor L1b and the second small-diameter loop shaped conductor L2b through a magnetic field. As shown in FIG. 3B, the first small-diameter loop shaped conductor L1b and the second small-diameter loop shaped conductor L2b are coupled to the power supply coil 30 through a magnetic field to form a coupling part CP of the booster antenna (the antenna resonance circuit) that contributes to coupling to the power supply coil 30 of the RFIC module 10 mainly through a magnetic field.

Figure 6A:
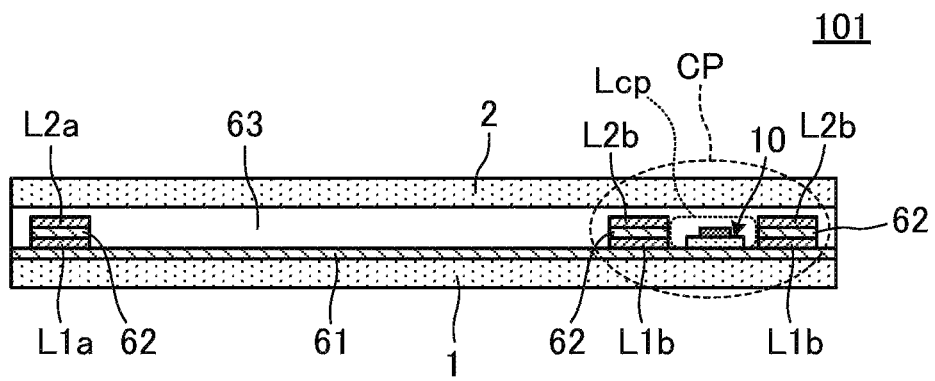
FIG. 6A is a cross-sectional view of the antenna device 101 according to the first embodiment.
Figure 6B:
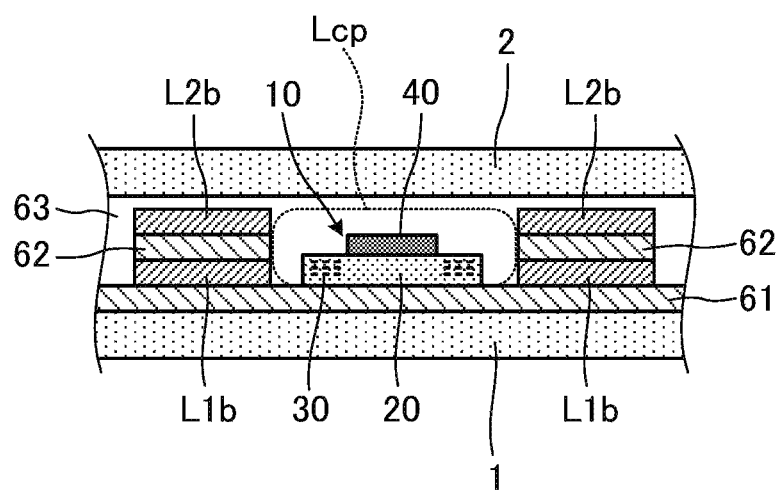
FIG. 6B is a detailed cross-sectional view of a part of the antenna device 101 having the RFIC module mounted thereon.

FIG. 6A is a cross-sectional view of the antenna device 101 according to the first embodiment, and FIG. 6B is a detailed cross-sectional view of a part of the antenna device 101 having an RFIC module mounted thereon. To easily understand the drawings and the principle of the disclosure, the structure of the antenna device 101 is simplified in FIGS. 6A and 6B.

The sealing layer 63 has an insulation property and is formed on the substantially entire surface of the base layer 1. The sealing layer 63 protects the RFIC module 10, the first coil conductor L1, the second coil conductor L2, and the like from externally applied impact or external force. While the sealing layer 63 is, for example, a resin, the sealing layer 63 may be a double-sided adhesive sheet or a layer formed of an adhesive having an adhesion property. When the sealing layer 63 is a double-sided adhesive sheet or an adhesive having an adhesion property, the protection layer 2 may be release paper. In this case, the protection layer 2 is removed to expose the sealing layer 63 having the adhesion property, and thus the antenna device 101 can be adhered to other members. While the present embodiment describes an example in which the sealing layer 63 is formed on the substantially entire surface of the base layer 1, the present embodiment is not limited to this example. The shape of the sealing layer 63 may be changed appropriately.

As shown in FIGS. 6A and 6B, the second large-diameter loop shaped conductor L2a is disposed to oppose the first large-diameter loop shaped conductor L1a with the insulating adhesive layer 62 interposed therebetween, and the second large-diameter loop shaped conductor L2a substantially overlaps the first large-diameter loop shaped conductor L1a in a planar view. A capacitive component is thus generated between the first large-diameter loop shaped conductor L1a and the second large-diameter loop shaped conductor L2a. The second small-diameter loop shaped conductor L2b is disposed to oppose the first small-diameter loop shaped conductor L1b with the insulating adhesive layer 62 interposed therebetween, and the second small-diameter loop shaped conductor L2b substantially overlaps the first small-diameter loop shaped conductor L1b in a planar view. A capacitive component is thus generated between the first small-diameter loop shaped conductor L1b and the second small-diameter loop shaped conductor L2b.

The first small-diameter loop shaped conductor L1b, the adhesive layer 62, and the second small-diameter loop shaped conductor L2b are overlapped and adhered to each other to form a recess (a cavity). In the present embodiment, this recess (the cavity) corresponds to the inside Lcp of the coil opening of the small-diameter loop shaped conductor. As shown in FIGS. 5A, 5B, 6A, 6B, and the like, the RFIC module 10 is disposed in the inside Lcp of the coil opening of the small-diameter loop shaped conductor. That is, the power supply coil 30 of the RFIC module 10 is disposed in a manner that its winding axis is aligned with the winding axis direction of the first small-diameter loop shaped conductor L1b and the second small-diameter loop shaped conductor L2b.

The outer diameter of the power supply coil 30 of the RFIC module 10 is smaller than the inner diameter of the first small-diameter loop shaped conductor L1b and the second small-diameter loop shaped conductor L2b. That is, the power supply coil 30 of the RFIC module 10 is disposed in a manner that its outer diameter is inside or within the coil opening of the first small-diameter loop shaped conductor L1b and the coil opening of the second small-diameter loop shaped conductor L2b in a planar view.

As shown in the antenna device 101, the first small-diameter loop shaped conductor L1b and the second small-diameter loop shaped conductor L2b circle around the power supply coil 30 and thus the power supply coil 30 is surrounded by the first small-diameter loop shaped conductor L1b and the second small-diameter loop shaped conductor L2b. The whole power supply coil 30 performs magnetic field coupling to the first small-diameter loop shaped conductor L1b and the second small-diameter loop shaped conductor L2b with a high degree of coupling. Consequently, the RFIC module 10 can receive magnetic field energy from the antenna coil of the communication target with high efficiency through the coupling part CP of the booster antenna.

Figure 7A:
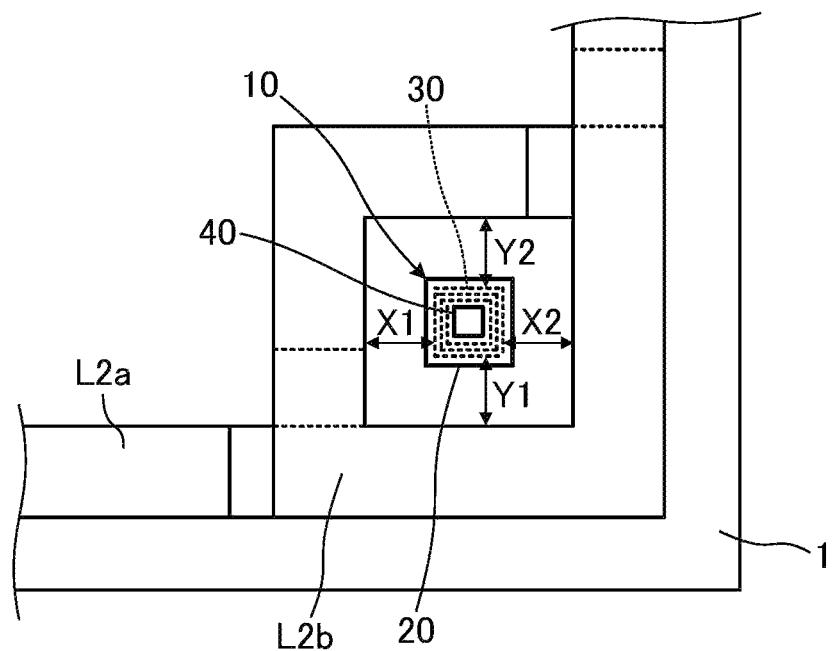
FIG. 7A is a detailed plan view of the part of the antenna device 101 having the RFIC module mounted thereon.
Figure 7B:
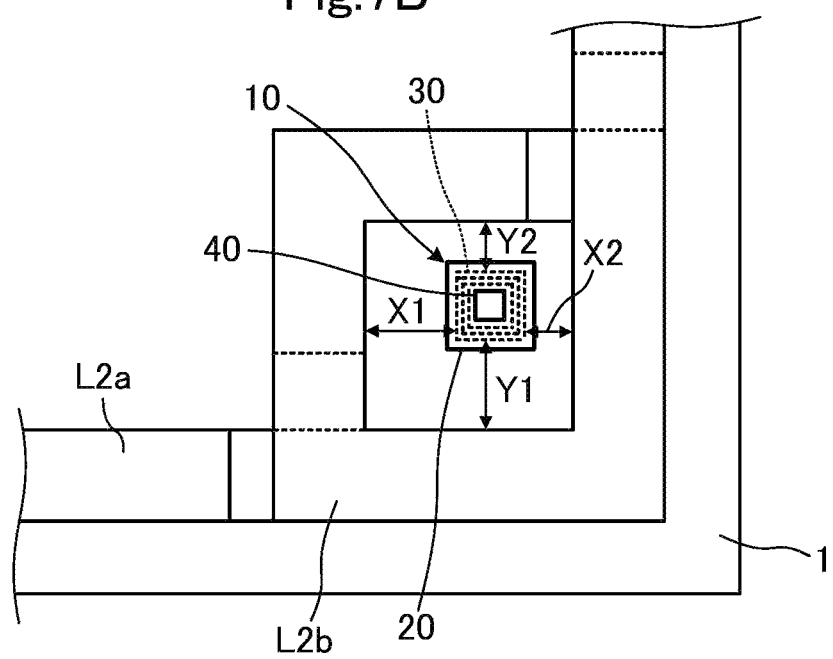
FIG. 7B is a detailed plan view of a part of an antenna device according to a reference example having an RFIC module mounted thereon.

Next, the relationship between the degree of coupling of the first small-diameter loop shaped conductor L1b and the second small-diameter loop shaped conductor L2b and the power supply coil 30 and the mounting position of the power supply coil 30 is described with reference to the drawings. FIG. 7A is a detailed plan view of a part of the antenna device 101 having the RFIC module mounted thereon, and FIG. 7B is a detailed plan view of a part of an antenna device according to a reference example having an RFIC module mounted thereon. The sizes of X1, X2, Y1, and Y2 are enlarged in FIGS. 7A and 7B.

As shown in FIG. 7A, the first small-diameter loop shaped conductor L1b, the second small-diameter loop shaped conductor L2b, and the power supply coil 30 of the RFIC module 10 are disposed in the antenna device 101 so that the winding axes thereof are aligned with each other. The distance between one end surface of each of the first small-diameter loop shaped conductor L1b and the second small-diameter loop shaped conductor L2b and the power supply coil 30 ("X1" or "Y1" in FIG. 7A) is substantially equal to the distance between the other end surface opposing the one end surface and the power supply coil 30 ("X2" or "Y2" in FIG. 7A) (X1≈X2 or Y1≈Y2). The whole power supply coil 30 thus performs stably magnetic field coupling to the first small-diameter loop shaped conductor L1b and the second small-diameter loop shaped conductor L2b with a high degree of coupling.

On the other hand, the winding axis of the power supply coil 30 of the RFIC module 10 is not aligned with the winding axis of the first small-diameter loop shaped conductor L1b and the second small-diameter loop shaped conductor L2b in the antenna device according to the reference example. The power supply coil 30 is disposed in the antenna device according to the reference example so as to be close to the other end surface opposing the one end surface (an upper right side in FIG. 7B). The distance between the one end surface of each of the first small-diameter loop shaped conductor L1b and the second small-diameter loop shaped conductor L2b and the power supply coil 30 thus increases ("X1" or "Y1" in FIG. 7B). The distance between the other end surface opposing the one end surface and the power supply coil 30 ("X2" or "Y2" in FIG. 7B) thus decreases accordingly.

The shorter the distance between the first small-diameter loop shaped conductor L1b and the second small-diameter loop shaped conductor L2b, and the power supply coil 30 is, the higher the degree of magnetic field coupling is. According to the antenna device of the reference example, the distance between the one end surface of each of the first small-diameter loop shaped conductor L1b and the second small-diameter loop shaped conductor L2b and the power supply coil 30 ("X1" or "Y1" in FIG. 7B) increases and thus the degree of coupling decreases. On the other hand, the distance between the other end surface opposing the one end surface and the power supply coil 30 ("X2" or "Y2" in FIG. 7B) decreases and thus the degree of coupling increases relatively.

Even if the mounting position of the power supply coil 30 is shifted relative to the winding axis of the first small-diameter loop shaped conductor L1b and the second small-diameter loop shaped conductor L2b, it is possible to prevent a significant change in the degree of coupling of the first small-diameter loop shaped conductor L1b and the second small-diameter loop shaped conductor L2b and the power supply coil 30. The antenna device 101 in which the power supply coil 30 is disposed inside the coil openings of the first small-diameter loop shaped conductor L1b and the second small-diameter loop shaped conductor L2b achieves a small change in the degree of coupling due to the mounting position of the power supply coil 30.

The power supply coil 30 is surrounded by the first small-diameter loop shaped conductor L1b and the second small-diameter loop shaped conductor L2b, and thus is preferably similar to the first small-diameter loop shaped conductor L1b and the second small-diameter loop shaped conductor L2b.

Figure 8:
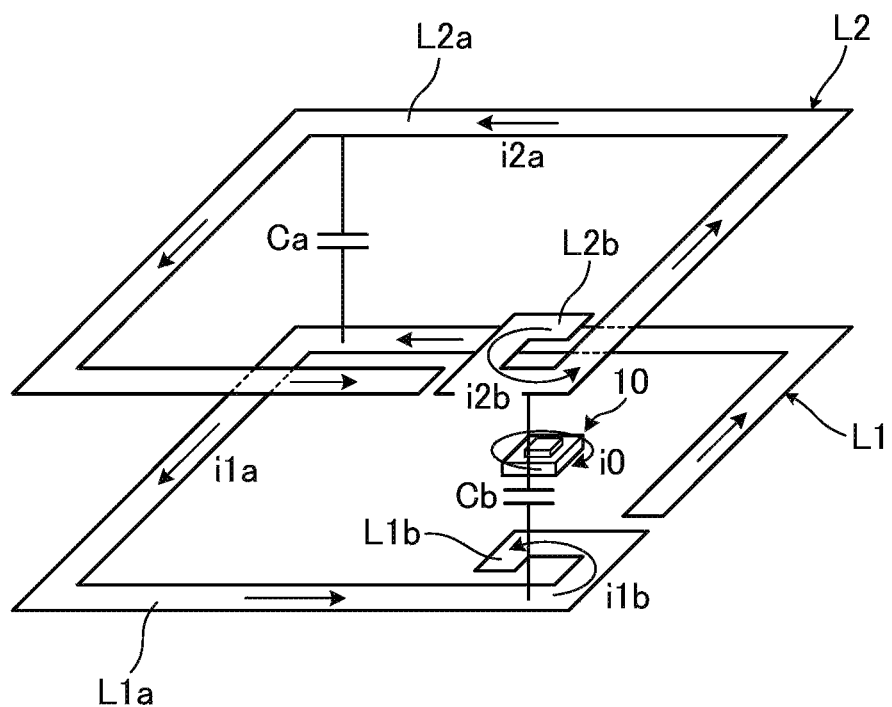
FIG. 8 is an exploded perspective view showing the operational principle of the antenna device 101 according to the first embodiment.
Figure 9A:
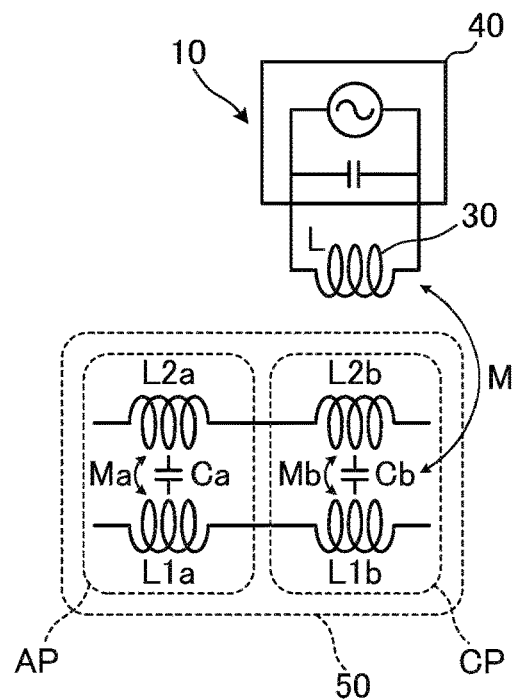
FIG. 9A is an equivalent circuit diagram of the antenna device 101 according to the first embodiment.
Figure 9B:
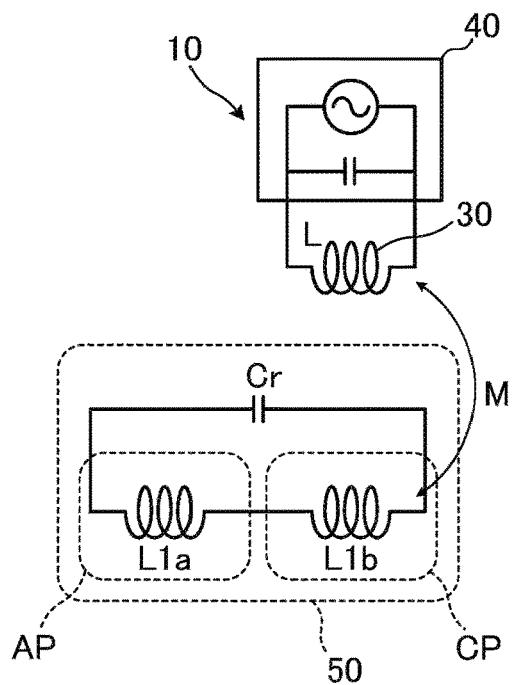
FIG. 9B is an equivalent circuit diagram of an antenna device 100 according to a modification of the first embodiment.

Next, the operational principle of the antenna device 101 is described with reference to the drawings. For example, FIG. 8 is an exploded perspective view showing the operational principle of the antenna device 101 according to the first embodiment. Specifically, FIG. 8 shows a way of coupling the power supply coil of the RFIC module 10 to the first coil conductor L1 and the second coil conductor L2. FIG. 9A is an equivalent circuit diagram of the antenna device 101 according to the first embodiment, and FIG. 9B is an equivalent circuit diagram of the antenna device 100 according to a modification of the first embodiment.

As shown in FIG. 8, a current i0 flowing in the power supply coil of the RFIC module 10 induces a current i1b in the first small-diameter loop shaped conductor L1b. That is, in a part where the power supply coil is close to the first small-diameter loop shaped conductor L1b, the current i0 enables the current i1b to flow in the first small-diameter loop shaped conductor L1b in a direction of cancelling out the current i0 (counterclockwise in FIG. 8). The first small-diameter loop shaped conductor L1b is connected to an end of the first large-diameter loop shaped conductor L1a, and thus the current i1b also flows in the first large-diameter loop shaped conductor L1a (a current i1a in FIG. 8). The current i1a has the same or substantially the same values as the current i1b.

The current i0 flowing in the power supply coil of the RFIC module 10 also induces a current i2b in the second small-diameter loop shaped conductor L2b. That is, in a part where the power supply coil is close to the second small-diameter loop shaped conductor L2b, the current i0 enables the current i2b to flow in the second small-diameter loop shaped conductor L2b in the direction of cancelling out the current i0 (counterclockwise in FIG. 8). The second small-diameter loop shaped conductor L2b is connected to an end of the second large-diameter loop shaped conductor L2a, and thus the current i2b also flows in the second large-diameter loop shaped conductor L2a (a current i2a in FIG. 8). The current i2a has the same or substantially the same values as the current i2b.

According to the present embodiment, the first coil conductor L1 and the second coil conductor L2 function as a booster antenna for the power supply coil. The antenna device 101 includes these booster antennas and thus has a larger opening of the coil functioning as an antenna than a coil opening of an antenna device including only the power supply coil. It is thus possible to increase the degree of coupling to an antenna coil of a communication target.

As shown in FIG. 8, the current (i1a, i1b) and the current (i2a, i2b) induced by the current i0 flowing in the power supply coil of the RFIC module 10 flow in the same direction (counterclockwise in FIG. 8). Here, the winding direction of the first small-diameter loop shaped conductor L1b is opposite to that of the second small-diameter loop shaped conductor L2b, and the winding direction of the first large-diameter loop shaped conductor L1a is also opposite to that of the second large-diameter loop shaped conductor L2a. A capacitive component is thus generated between the first small-diameter loop shaped conductor L1b and the second small-diameter loop shaped conductor L2b (a capacity Cb in FIG. 8), and a capacitive component is also generated between the first large-diameter loop shaped conductor L1a and the second large-diameter loop shaped conductor L2a (a capacity Ca in FIG. 8).

The capacity Ca, Cb (the capacitance) between the first coil conductor L1 and the second coil conductor L2 may be set to desired values by changing the material or thickness of the adhesive layer 62.

As shown in FIG. 9A, in the first coil conductor L1 and the second coil conductor L2, inductance components of the first coil conductor L1 and the second coil conductor L2 (L1a, L1b, L2a, and L2b) and capacitive components between the first coil conductor L1 and the second coil conductor L2 (i.e., the capacity Ca between the first large-diameter loop shaped conductor L1a and the second large-diameter loop shaped conductor L2a and the capacity Cb between the first small-diameter loop shaped conductor L1b and the second small-diameter loop shaped conductor L2b) form an antenna resonance circuit. The resonance frequency of the antenna resonance circuit (the booster antenna 50) is set to a frequency that is equal or substantially equal to the communication frequency of the RFID system (for example, 13.56 MHz).

The power supply coil 30 is surrounded by the first small-diameter loop shaped conductor L1b and the second small-diameter loop shaped conductor L2b, and thus the antenna device 101 according to the present embodiment has a high degree of coupling $K_{CP}$ of the coupling part CP and the power supply coil 30. High degree of coupling $K_{CP}$ allows the power supply coil 30 to receive magnetic field energy from an antenna coil of a communication target with high efficiency, but the mutual inductance M between the coupling part CP and the power supply coil 30 increases. Large mutual inductance M changes the inductance component of the whole booster antenna 50 (L1a+L1b+L2a+L2b), and thus the resonance frequency of the booster antenna 50 also changes. The inductance component of the power supply coil 30 changes, and thus the resonance frequency of the RFIC module 10 also changes.

The inductance components of the first small-diameter loop shaped conductor L1b and the second small-diameter loop shaped conductor L2b of the antenna device 101 according to the present embodiment are small (i.e., the inductance components are relatively smaller than the inductance required for the first coil conductor L1 and the second coil conductor L2). For example, the inductance component of the coupling part CP (L1b+L2b) is set to be equal to or less than ⅕ of the inductance component of the whole booster antenna 50 (L1a+L1b+L2a+L2b). The mutual inductance M between the first small-diameter loop shaped conductor L1b and the second small-diameter loop shaped conductor L2b, and the power supply coil 30 is relatively smaller than the overall mutual inductance of the first coil conductor L1 and the second coil conductor L2.

Even if the mounting position of the RFIC module 10 is shifted relative to the first small-diameter loop shaped conductor L1b and the second small-diameter loop shaped conductor L2b, variations in the mutual inductance M due to changes in the degree of coupling $K_{CP}$ are small. Consequently, it is possible to reduce variations in the resonance frequency of the booster antenna 50 (the antenna resonance circuit) and in the resonance frequency of the RFIC module 10. That is, the change rate of the resonance frequency of the booster antenna 50 (the antenna resonance circuit) and the RFIC module 10 due to the mounting position of the RFIC module 10 is small.

Specific preferred parameters of the antenna device according to the present disclosure are as follows. The inductance components of the respective parts are indicated in correspondence with the reference signs of the respective parts.

Degree of coupling of coupling part CP and power supply coil 30: $K_{CP}$=0.1 or more and 0.6 or less.

(Inductance component of coupling part CP: L1b+L2b)≥(Inductance component of whole booster antenna 50: L1a+L1b+L2a+L2b)×⅕.

Degree of coupling of booster antenna 50 and power supply coil 30: $K_{AL}$=0.02 or more and 0.1 or less.

According to the present embodiment, it is possible to easily form an antenna device with the parameters. The parameters are only an example and not limited to these values.

As shown in FIG. 9B, a capacitive component Cr may be connected between one end of the first coil conductor L1 (i.e., the first large-diameter loop shaped conductor L1a and the first small-diameter loop shaped conductor L1b) and the other end thereof, achieving the booster antenna 50 (i.e., the antenna resonance circuit) formed by only the first coil conductor L1. This capacitive component Cr is, for example, a chip capacitor. As described above, the booster antenna 50 may be formed by only the first coil conductor L1.

Advantageously, the exemplary embodiment described herein has the following effects.

In the antenna device 101 according to the present embodiment, the power supply coil 30 is disposed in a manner that its winding direction is aligned with the winding axis direction of the first small-diameter loop shaped conductor L1b and the second small-diameter loop shaped conductor L2b and its outer diameter is inside the coil opening of the first small-diameter loop shaped conductor L1b and the coil opening of the second small-diameter loop shaped conductor L2b. That is, the power supply coil 30 is accommodated in a recess surrounded by the first small-diameter loop shaped conductor L1b and the second small-diameter loop shaped conductor L2b (the inside Lcp of the coil opening of the small-diameter loop shaped conductor). Even if the mounting position of the power supply coil 30 is shifted, it is possible to prevent a significant change in the degree of coupling and to reduce a variation in mutual inductance due to the significant change in the degree of coupling. Consequently, a change in the degree of coupling due to the mounting position of the power supply coil 30 relative to the first coil conductor L1 and the second coil conductor L2, that is, relative to an antenna coil is small. Therefore, it is possible to reduce variations in the resonance frequency of the first coil conductor L1 and the second coil conductor L2 functioning as the booster antenna 50 (i.e., the antenna resonance circuit) and in the resonance frequency of the RFIC module 10 (i.e., the resonance circuit formed by the RFIC element 40 and the power supply coil 30), so that a stable communicable distance is achieved.

In the antenna device 101 according to the present embodiment, the power supply coil 30 is accommodated in the recess surrounded by the first small-diameter loop shaped conductor L1b and the second small-diameter loop shaped conductor L2b. It is thus possible to obtain a thinner antenna device than an antenna device having the power supply coil 30 of the RFIC module 10 mounted on a surface of the booster antenna 50.

In the antenna device 101 according to the present embodiment, the first coil conductor L1 and the second coil conductor L2 function as the booster antenna 50 for the power supply coil 30. In the first coil conductor L1 and the second coil conductor L2, the inductance components of the first coil conductor L1 and the second coil conductor L2 and the capacitive component between the first coil conductor L1 and the second coil conductor L2 form the antenna resonance circuit. The antenna device 101 eliminates a capacitance element for a resonance circuit and thus can be easily manufactured at a low cost.

In the antenna device 101 according to the present embodiment, the power supply coil 30 does not overlap the first small-diameter loop shaped conductor L1b and the second small-diameter loop shaped conductor L2b in a planar view. That is, a conductor surface of the power supply coil 30 does not oppose conductor surfaces of the first small-diameter loop shaped conductor L1b and the second small-diameter loop shaped conductor L2b. In the antenna device 101, the power supply coil 30 is only allowed to oppose end surfaces of the first small-diameter loop shaped conductor L1b and the second small-diameter loop shaped conductor L2b, which are thin metal plates. It is thus possible to reduce a capacitive component between the first small-diameter loop shaped conductor L1b and the second small-diameter loop shaped conductor L2b, and the power supply coil 30. Additionally, it is possible to reduce variations in the resonance frequency of the booster antenna 50 and in the resonance frequency of the resonance circuit formed by the RFIC element 40 and the power supply coil 30. Therefore, it is possible to increase the degree of coupling to an antenna coil of a communication target.

In the antenna device 101 according to the present embodiment, the second coil conductor L2, which is a thin metal plate, is adhered to the base layer 1, and the first coil conductor L1, which is a thin metal plate, is stacked on the second coil conductor L2 and then adhered thereto with the insulating adhesive layer 62 interposed between the first coil conductor L1 and the second coil conductor L2. This structure enables the booster antenna 50 (i.e., the antenna resonance circuit) to be formed more easily than a case where the first coil conductor L1 and the second coil conductor L2 are patterned by etching an Al foil.

Additionally, it is possible to obtain a thinner antenna device than an antenna device in which the first coil conductor L1 and the second coil conductor L2 are respectively formed on both principal surfaces of the base layer 1 to form the booster antenna 50 (i.e., the antenna resonance circuit).

In the antenna device 101 according to the present embodiment, the number of windings of the first small-diameter loop shaped conductor is substantially 1 and the number of windings of the second small-diameter loop shaped conductor is substantially 1. This structure allows for a small mutual inductance M between the first small-diameter loop shaped conductor L1b and the second small-diameter loop shaped conductor L2b, and the power supply coil 30 of the RFIC module 10. Even if the mounting position of the power supply coil 30 is shifted relative to the first small-diameter loop shaped conductor L1b and the second small-diameter loop shaped conductor L2b, it is possible to reduce a variation in the mutual inductance M. Consequently, it is possible to reduce variations in the resonance frequency of the booster antenna 50 (i.e., the antenna resonance circuit) and in the resonance frequency of the RFIC module 10.

In the present embodiment, the first small-diameter loop shaped conductor L1b and the second small-diameter loop shaped conductor L2b that are coupled to the power supply coil 30 through a magnetic field are disposed in the large-diameter loop shaped conductor formation area L1e in a planar view. It is thus possible to form the coil opening of the booster antenna 50 (i.e., the antenna resonance circuit) to be large relative to the base layer 1, and thus more magnetic flux can link the antenna coil of the communication target. That is, it is possible to increase the degree of coupling to the antenna coil of the communication target.

In the antenna device 101 according to the present embodiment, the number of windings of the first large-diameter loop shaped conductor L1a is substantially 1 and the number of windings of the second large-diameter loop shaped conductor L2a is substantially 1. The numbers of windings of the first large-diameter loop shaped conductor L1a and the second large-diameter loop shaped conductor L2a are small, and thus it is possible to form the width of the first large-diameter loop shaped conductor L1a and the second large-diameter loop shaped conductor L2a to be large, while the effective coil opening of the booster antenna 50 (an antenna part AP) is kept large. Even if the positions where the first large-diameter loop shaped conductor L1a and the second large-diameter loop shaped conductor L2a that are disposed to oppose to each other are formed are shifted, it is possible to reduce a variation in the capacity Ca (capacitance) between the first large-diameter loop shaped conductor L1a and the second large-diameter loop shaped conductor L2a. Consequently, it is possible to reduce a variation in the resonance frequency of the booster antenna 50 (i.e., the antenna resonance circuit) formed by the first coil conductor L1 and the second coil conductor L2. Further, the first large-diameter loop shaped conductor L1a and the second large-diameter loop shaped conductor L2a have a small resistance component, and thus it is possible to obtain the booster antenna 50 having a high Q value.

According to the present embodiment, the number of windings of the first coil conductor L1 (i.e., the first large-diameter loop shaped conductor L1a and the first small-diameter loop shaped conductor L1b) is substantially 1, and the number of windings of the second coil conductor L2 (i.e., the second large-diameter loop shaped conductor L2a and the second small-diameter loop shaped conductor L2b) is substantially 1. Consequently, the identical coil conductors are not adjacent to each other and substantially no line capacity is generated. It is thus possible to prevent a change in a capacitive component (capacitance) caused by adhesion of water droplets or the like to the booster antenna 50 (the antenna resonance circuit). Therefore, the antenna device according to the present disclosure can be used for tags to which water droplets could be attached or tags attached to trays or packages for high-moisture perishable foods.

The first small-diameter loop shaped conductor L1b is wound in the same winding direction as the first large-diameter loop shaped conductor L1a in a planar view and the second small-diameter loop shaped conductor L2b is wound in the same winding direction as the second large-diameter loop shaped conductor L2a in a planar view. In this structure, the direction of the current i1b flowing in the first small-diameter loop shaped conductor L1b and the current i2b flowing in the second small-diameter loop shaped conductor L2b is aligned with the direction of the current i1a flowing in the first large-diameter loop shaped conductor L1a and the current i2a flowing in the second large-diameter loop shaped conductor L2a. A magnetic field generated in the first large-diameter loop shaped conductor L1a and the second large-diameter loop shaped conductor L2a is not cancelled out by a magnetic field generated in the first small-diameter loop shaped conductor L1b and the second small-diameter loop shaped conductor L2b. Consequently, the area of the effective coil opening of the booster antenna 50 (the antenna part AP) can be kept large and the degree of coupling to the antenna coil of the communication target can be increased, so that a communication distance can be increased.

According to the present embodiment, the RFIC element 40 and the power supply coil 30 are incorporated in one chip to form the RFIC module 10. It is thus possible to easily form an antenna device only by disposing the RFIC module 10 inside the coil opening of the first small-diameter loop shaped conductor L1b and the coil opening of the second small-diameter loop shaped conductor L2b.

Preferably, the RFIC module 10 according to the present embodiment includes the laminate 20 formed by laminating a plurality of base layers. Further, the power supply coil 30 is formed in an interior of the laminate 20 and the RFIC element 40 is formed on a surface of the laminate 20. This structure enables the number of windings of the power supply coil 30 to be changed easily, thus achieving a desired inductance value. The RFIC element 40 may be incorporated in (mounted on) the interior of the laminate 20.

In the antenna device 101 according to the present embodiment, winding axes of the first small-diameter loop shaped conductor L1b, the second small-diameter loop shaped conductor L2b, and the power supply coil 30 are aligned with each other. It is thus possible to increase the degree of coupling of the first coil conductor L1 and the second coil conductor L2, and the RFIC module 10, and the degree of coupling to the antenna coil of the communication target, accordingly.

The antenna device 101 according to the present embodiment is manufactured by, for example, the following steps. FIGS. 10A to 10F are cross-sectional views of steps of manufacturing the antenna device 101.

Figure 10A:
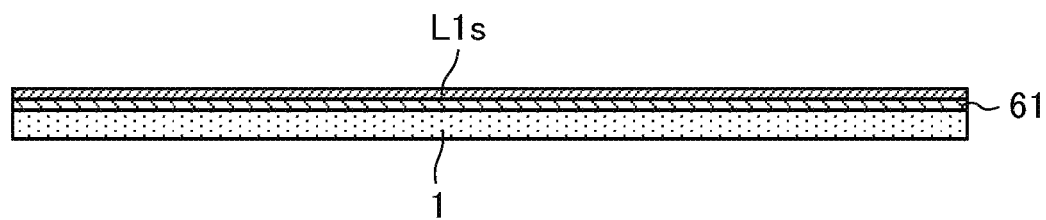
FIGS. 10A to 10F are cross-sectional views of steps of manufacturing the antenna device 101.

As shown in FIG. 10A, the base layer 1 having a metal foil adhered thereto is prepared. Specifically, a metal foil L1s is disposed substantially entirely on (e.g., adhered to) one principal surface of the base layer 1 with the adhesive layer 61 interposed therebetween. The metal foil L1s is, for example, an Al foil. While the base layer 1 has an insulation property and is, for example, a PET sheet as described above, the base layer 1 may be coated paper or the like. While the adhesive layer 61 has insulation and adhesion properties and is, for example, a double-sided adhesive sheet as described above, the adhesive layer 61 may be a layer formed of an adhesive having an adhesion property or the like.

Figure 10B:
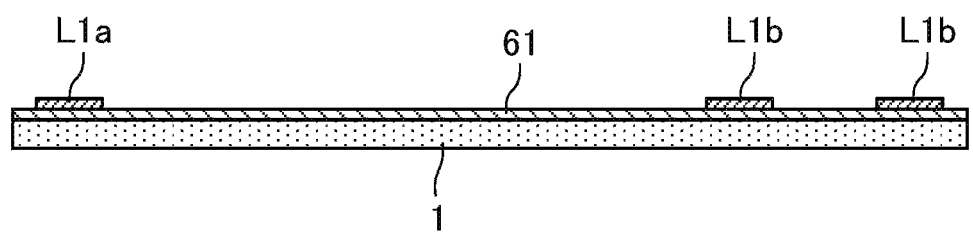

Next, the metal foil L1s adhered to the one principal surface of the base layer 1 is patterned by etching as shown in FIG. 10B to form the first coil conductor L1 (i.e., the first large-diameter loop shaped conductor L1a and the first small-diameter loop shaped conductor L1b). The first coil conductor L1 includes the second large-diameter loop shaped conductor L1a and the first small-diameter loop shaped conductor L1b that is connected to the first end (i.e., E11 as shown in FIG. 3B) of the first large-diameter loop shaped conductor L1a.

Next, a thin metal plate is punched to form the second coil conductor L2. The second coil conductor L2 includes the second large-diameter loop shaped conductor L2a and the second small-diameter loop shaped conductor L2b that is connected to the first end (i.e., E21 as shown in FIG. 3B) of the second large-diameter loop shaped conductor L2a. As described above, the second coil conductor L2 is, for example, an Al foil.

Figure 10C:
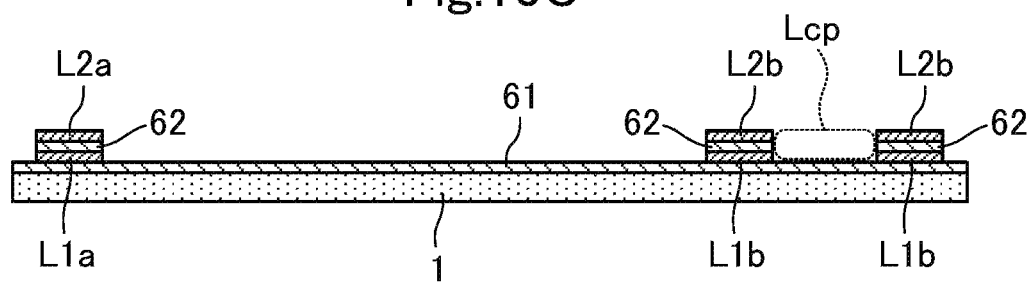

Next, the adhesive layer 62 is formed on the first coil conductor L1 (i.e., the first large-diameter loop shaped conductor L1a and the first small-diameter loop shaped conductor L1b) as shown in FIG. 10C. Specifically, the adhesive layer 62 is formed on the first coil conductor L1 by screen printing or the like. The adhesive layer 62 has insulation and adhesion properties and is, for example, an adhesive patterned by printing.

The second coil conductor L2 is then stacked on and adhered to the first coil conductor L1 so as to oppose the first coil conductor L1 with the insulating adhesive layer 62 interposed therebetween. Specifically, the second coil conductor L2 is adhered to the first coil conductor L1 in a manner that the first large-diameter loop shaped conductor L1a is disposed to oppose the second large-diameter loop shaped conductor L2a with the adhesive layer 62 interposed therebetween and the first small-diameter loop shaped conductor L1b is disposed to oppose the second small-diameter loop shaped conductor L2b with the adhesive layer 62 interposed therebetween. The first small-diameter loop shaped conductor L1b, the adhesive layer 62, and the second small-diameter loop shaped conductor L2b are stacked and adhered to each other, and thus a recess (a cavity) is formed as shown in FIG. 10C. As described above, this recess (the cavity) corresponds to the inside Lcp of the coil opening of the small-diameter loop shaped conductor.

Figure 10D:
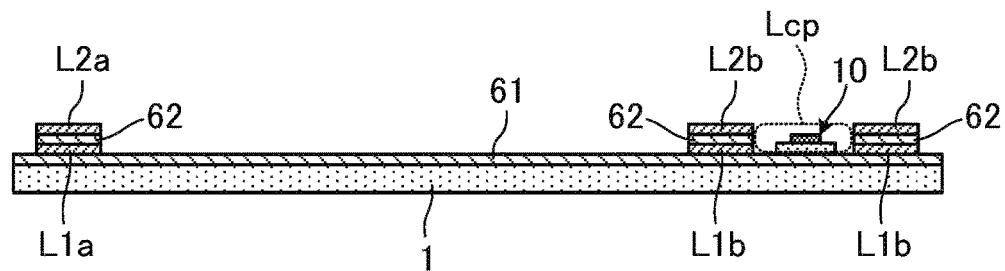

Next, the RFIC module 10 is disposed on the base layer 1 as shown in FIG. 10D. Specifically, the RFIC module 10 is mounted on (e.g., adhered to) the adhesive layer 61 of the base layer 1 in the inside Lcp of the coil opening of the small-diameter loop shaped conductor. In other words, the RFIC module 10 is accommodated in the recess surrounded by the first small-diameter loop shaped conductor L1b and the second small-diameter loop shaped conductor L2b (i.e., the inside Lcp of the coil opening of the small-diameter loop shaped conductor).

While the present embodiment describes an example in which the RFIC module 10 is mounted on (e.g., adhered to) the adhesive layer 61 of the base layer 1 in the inside Lcp of the coil opening of the small-diameter coil conductor, the present embodiment is not limited to this example. As described later, it is only required that a power supply coil connected to an RFIC element is mounted on (e.g., adhered to) the adhesive layer 61 of the base layer 1 and disposed in the inside Lcp of the coil opening of the small-diameter loop shaped conductor.

Figure 10E:
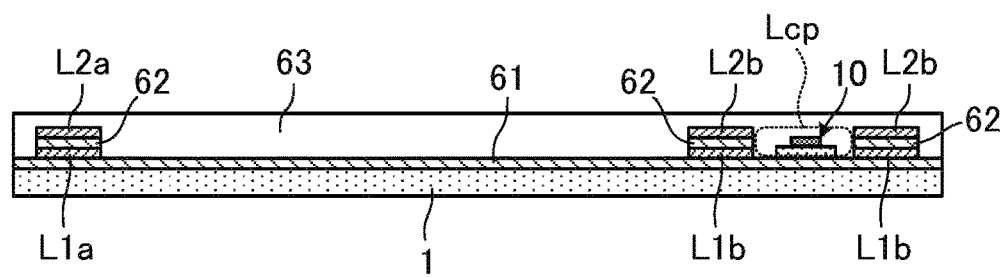

Next, as shown in FIG. 10E, the sealing layer 63 is formed to protect the RFIC module 10, the first coil conductor L1, and the second coil conductor L2 from externally applied impact or external force, as necessary. While the sealing layer 63 has an insulation property and is, for example, a resin, the sealing layer 63 may be a double-sided adhesive sheet or an adhesive having an adhesion property.

Figure 10F:
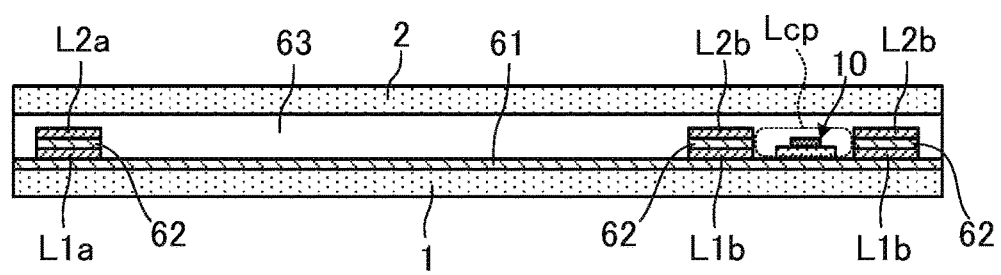

Next, as shown in FIG. 10F, the protection layer 2 is formed on the sealing layer 63 as necessary. While the protection layer 2 is, for example, a PET sheet, the protection layer 2 may be coated paper or release paper. When the sealing layer 63 is a double-sided adhesive sheet or an adhesive having an adhesion property and the protection layer 2 is release paper, the protection layer 2 may be removed to expose the sealing layer 63 having an adhesion property, so that the antenna device 101 can be adhered to other members.

The steps described above are performed on a motherboard. The motherboard is finally cut into each unit (each piece) of an antenna device.

This manufacturing method can reduce variations in the resonance frequency of the booster antenna 50 and in the resonance frequency of the resonance circuit formed by the RFIC element 40 and the power supply coil 30, even if the mounting position of the power supply coil 30 is shifted. Additionally, the manufacturing method allows for easy manufacturing of the thin antenna device 101.

Second Embodiment

Figure 11A:
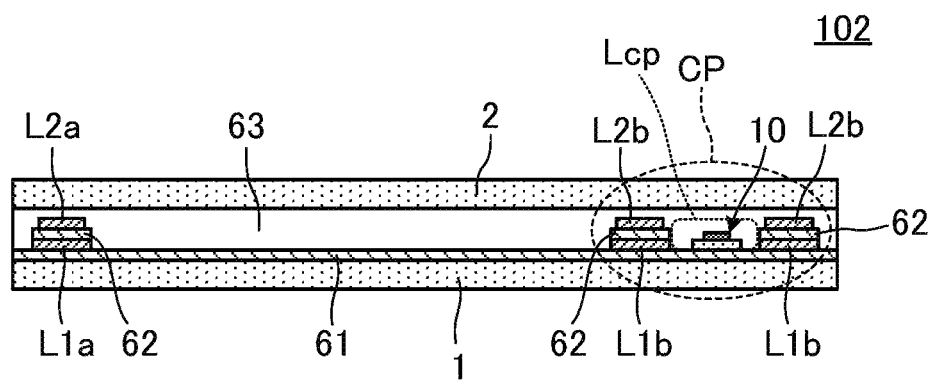
FIG. 11A is a cross-sectional view of an antenna device 102 according to a second embodiment.
Figure 11B:
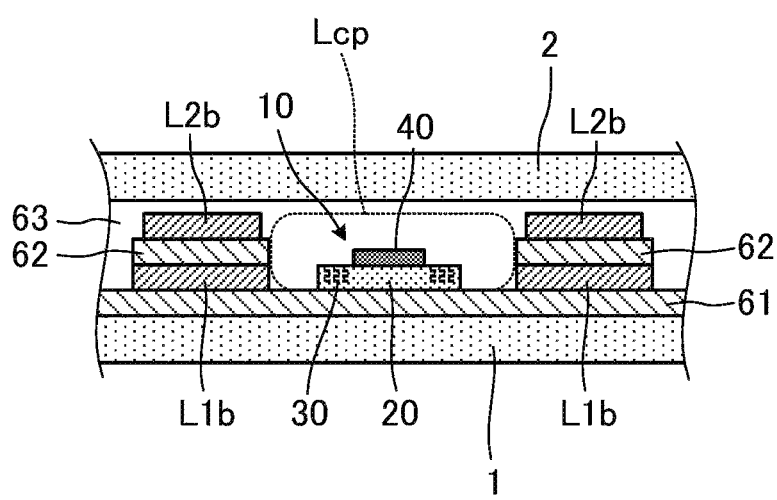
FIG. 11B is a detailed cross-sectional view of a part of the antenna device 102 having an RFIC module mounted thereon.

An antenna device according to a second embodiment is described with reference to the drawings. FIG. 11A is a cross-sectional view of an antenna device 102 according to the second embodiment, and FIG. 11B is a detailed cross-sectional view of a part of the antenna device 102 having an RFIC module mounted thereon. To easily understand the drawings and the principle of the disclosure, the structure of the antenna device 102 is simplified in FIGS. 11A and 11B.

As shown, the antenna device 102 according to the second embodiment is different from the antenna device 101 according to the first embodiment in the shape of a first coil conductor L1 and a second coil conductor L2. Other structures of the antenna device 102 according to the second embodiment are the same as those of the antenna device 101 according to the first embodiment.

The differences between the antenna device 101 according to the first embodiment is described below.

A first large-diameter loop shaped conductor L1a has a larger width than a second large-diameter loop shaped conductor L2a as shown in FIGS. 11A and 11B. A first small-diameter loop shaped conductor L1b also has a larger width than a second small-diameter loop shaped conductor L2b. That is, the first coil conductor L1 has a larger width than the second coil conductor L2.

Although the antenna device 102 has such a structure, the basic structure of the antenna device 102 is the same as that of the antenna device 101 according to the first embodiment, and the antenna device 102 can achieve operations and effects similar to those of the antenna device 101.

The first coil conductor L1 has a larger width than the second coil conductor L2 in the antenna device 102 according to the present embodiment. This structure can keep capacitive components between the first coil conductor L1 and the second coil conductor L2 (i.e., the capacity between the first large-diameter loop shaped conductor L1a and the second large-diameter loop shaped conductor L2a and the capacity between the first small-diameter loop shaped conductor L1b and the second small-diameter loop shaped conductor L2b) constant and reduce a variation in resonance frequency even if the positions where the first coil conductor L1 and the second coil conductor L2 are formed are shifted.

Third Embodiment

Figure 12:
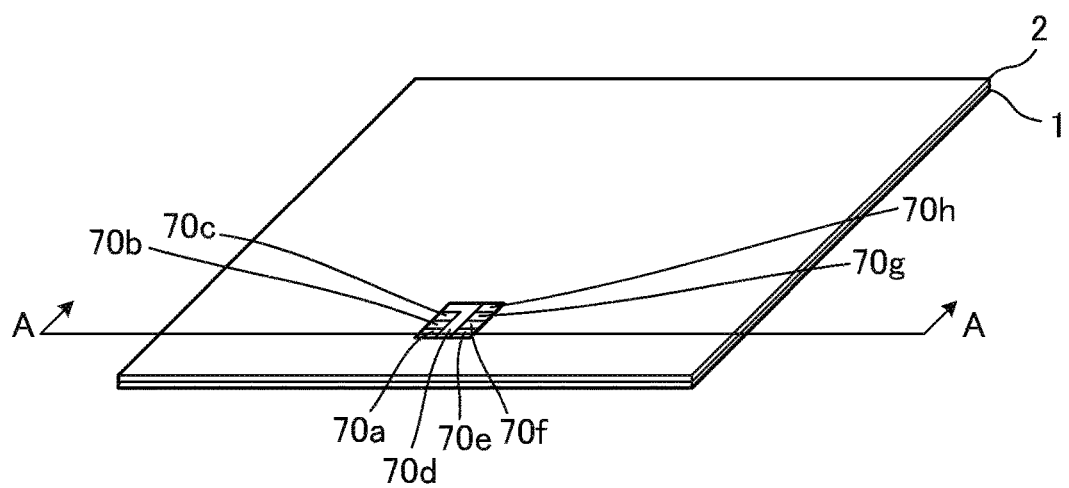
FIG. 12 is an external perspective view of an antenna device 103 according to a third embodiment.
Figure 13A:
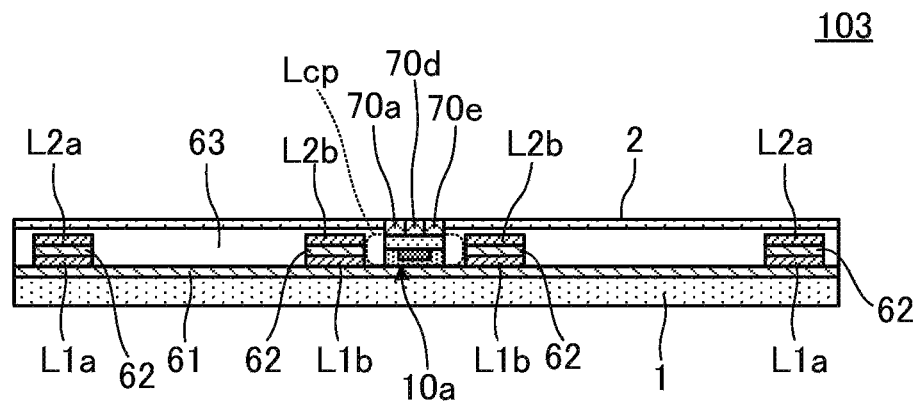
FIG. 13A is a cross-sectional view taken along a line A-A in FIG. 12.
Figure 13B:
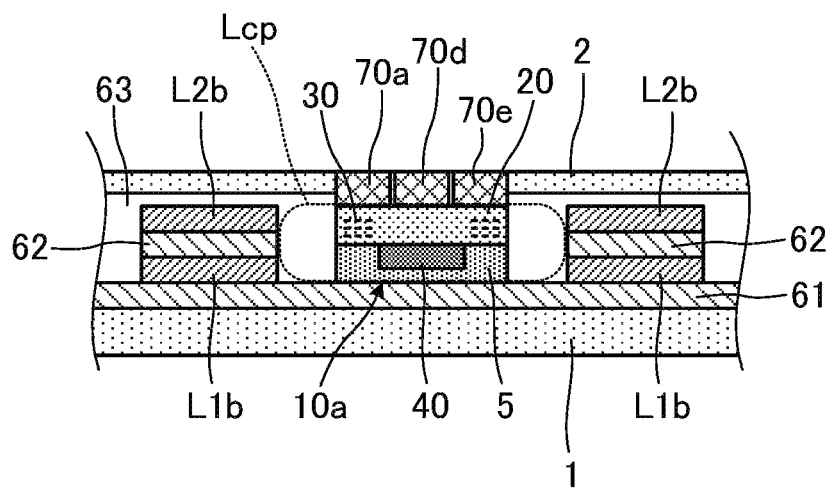
FIG. 13B is a detailed cross-sectional view of a part of the antenna device 103 having an RFIC module mounted thereon.

An antenna device according to a third embodiment is described with reference to the drawings. FIG. 12 is an external perspective view of an antenna device 103 according to the third embodiment. FIG. 13A is a cross-sectional view taken along a line A-A in FIG. 12, and FIG. 13B is a detailed cross-sectional view of a part of the antenna device 103 having an RFIC module mounted thereon. To easily understand the drawings and the principle of the embodiment, the structure of the antenna device 103 is simplified in FIGS. 13A and 13B.

As shown, the antenna device 103 according to the third embodiment is different from the antenna device 101 according to the first embodiment in the shape of a first coil conductor L1 and a second coil conductor L2. Additionally, the antenna device 103 is different from the antenna device 101 in that the antenna device 103 includes an RFIC module 10*a*. The antenna device 103 is different from the antenna device 101 in the mounting position of the RFIC module on a base layer 1. Moreover, the antenna device 103 is different from the antenna devices 101 and 102 in that the RFIC module is upside down and disposed on (e.g., adhered to) a principal surface of the base layer 1. Other structures of the antenna device 103 according to the third embodiment are the same as those of the antenna device 101 according to the first embodiment.

The differences between the antenna device 101 according to the first embodiment is described below.

As shown in FIG. 12, a first small-diameter loop shaped conductor L1b and a second small-diameter loop shaped conductor L2b of the antenna device 103 are formed near the middle of one of sides of the base layer 1 (i.e., a lower side of the base layer 1 in FIG. 12).

The RFIC module 10*a* includes an RFIC element 40, a laminate 20, a power supply coil 30 that is formed in the interior of the laminate 20, contact-communication external electrodes 70*a*, 70*b*, 70*c*, 70*d*, 70*e*, 70*f*, 70*g*, and 70*h*, and a sealing resin 5.

The contact-communication external electrodes 70*a* to 70*h* are thin metal plates and disposed on (e.g., adhered to) a surface of the laminate 20 different from a surface having the RFIC element 40 mounted thereon through an adhesive layer (not shown). The contact-communication external electrodes 70*a* to 70*h* are, for example, Cu foils having a surface plated with Ni/Au. The contact-communication external electrodes 70*a* to 70*h* are connected to the RFIC element 40 using an inter-layer connection conductor in the laminate 20 (not shown) or wire bonding and electrically connected to the RFIC element 40.

The sealing resin 5 protects the RFIC element 40 from externally applied impact or external force. The RFIC module 10*a* includes the sealing resin 5 and thus it is possible to improve the reliability of electrical connection of the RFIC element 40 and the mechanical strength of the RFIC module 10*a*. While the present embodiment describes an example in which the sealing resin 5 covers the entire surface of the laminate 20 having the RFIC element 40 mounted thereon (a lower surface of the laminate 20 in FIGS. 13A and 13B), the present embodiment is not limited to this example.

As shown in FIGS. 13A and 13B, a surface of the RFIC module 10*a* on the side of the sealing resin 5 (the side of the RFIC element 40) is disposed on (e.g., adhered to) the principal surface of the base layer 1 through an adhesive layer 61. The power supply coil 30 is accommodated in a recess surrounded by the first small-diameter loop shaped conductor L1b and the second small-diameter loop shaped conductor L2b (i.e., inside Lcp of a coil opening of a small-diameter loop shaped conductor), similar to the antenna device 101. The power supply coil 30 is disposed in a manner that its winding direction is aligned with the winding axis direction of the first small-diameter loop shaped conductor L1b and the second small-diameter loop shaped conductor L2b, and its outer diameter is inside the coil opening of the first small-diameter loop shaped conductor L1b and the coil opening of the second small-diameter loop shaped conductor L2b.

According to the present embodiment, holes are formed in the protection layer 2 so as to overlap the RFIC module 10*a* in a planar view. These holes are formed substantially in the same shape as the contact-communication external electrodes 70*a* to 70*h*. As shown in FIG. 12 and FIGS. 13A and 13B, in the antenna device 103 according to the present embodiment, the contact-communication external electrodes 70*a* to 70*h* are embedded in one principal surface of the antenna device 103 (an upper principal surface in FIGS. 13A and 13B) to be exposed from the protection layer 2.

Although the antenna device 103 has such a structure, the basic structure of the antenna device 103 is the same as that of the antenna device 101 according to the first embodiment, and the antenna device 103 can achieve operations and effects similar to those of the antenna device 101. The antenna device 103 according to the present embodiment not only performs non-contact near-field radio communication but also allows the contact-communication external electrodes 70a to 70h to physically contact electrodes of a communication target (e.g., a card reader/writer) to perform communication.

As described in the present embodiment, the position of a coupling part of the RFIC module 10a and the booster antenna 50 (i.e., an antenna resonance circuit) is not limited to a corner of the first coil conductor L1 and the second coil conductor L2 and may be changed appropriately.

While the present embodiment describes an example in which the sealing resin 5 (the RFIC element 40) of the RFIC module 10a is disposed on (e.g., adhered to) the base layer 1, the present disclosure is not limited to this example. The laminate 20 of the RFIC module 10a may be disposed on (e.g., adhered to) the base layer 1 as in the antenna device 101 and the antenna device 102 according to the embodiments described above.

While the present embodiment describes an example in which the contact-communication external electrodes 70a to 70h of the RFIC module 10a are formed on the laminate 20, the present embodiment is not limited to this example. These contact-communication external electrodes may be formed on the sealing resin 5. While the present embodiment describes an example in which the RFIC module 10a includes eight contact-communication external electrodes, the present embodiment is not limited to this example. The number and shape of the contact-communication external electrodes of the RFIC module 10a may be changed appropriately.

Fourth Embodiment

Figure 14A:
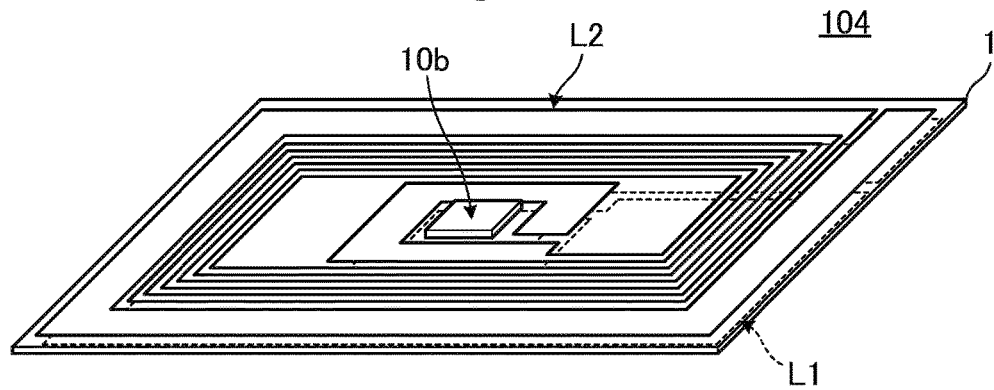
FIG. 14A is an external perspective view of an antenna device 104 according to a fourth embodiment.
Figure 14B:
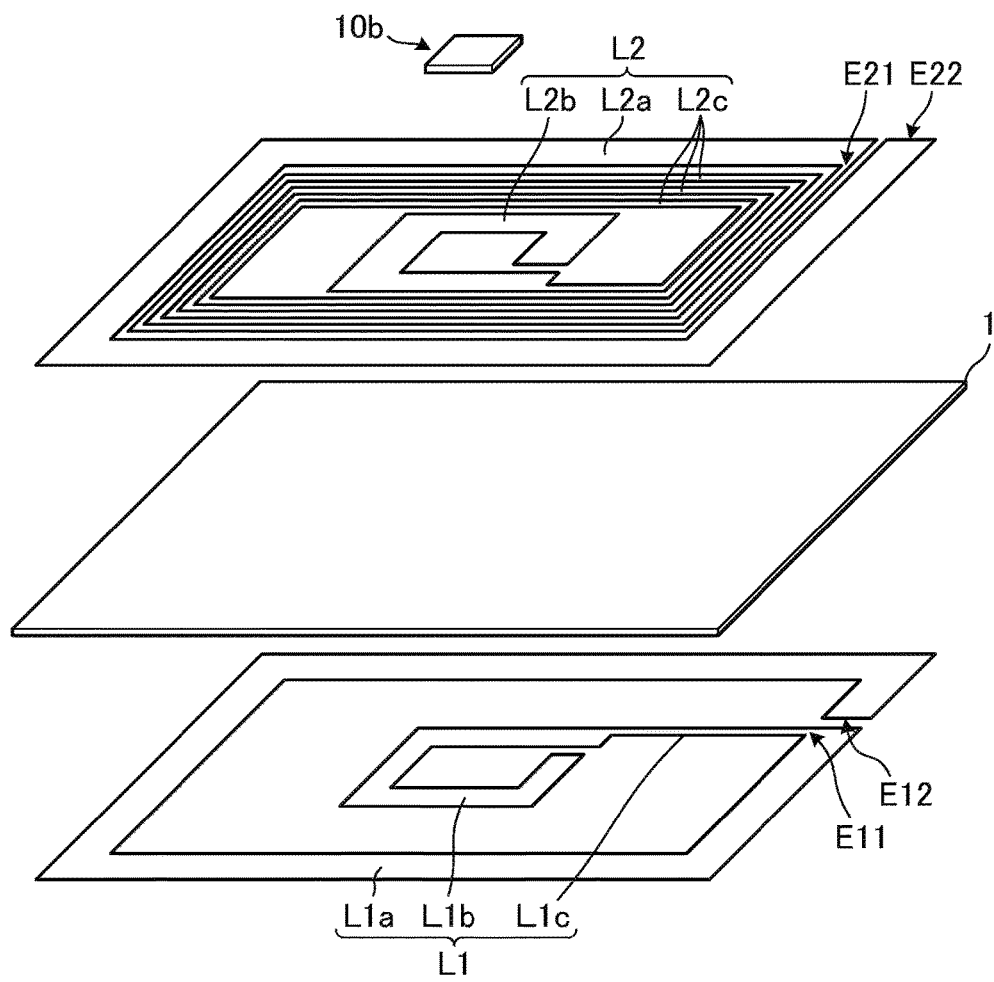
FIG. 14B is an exploded perspective view of the antenna device 104.
Figure 15:
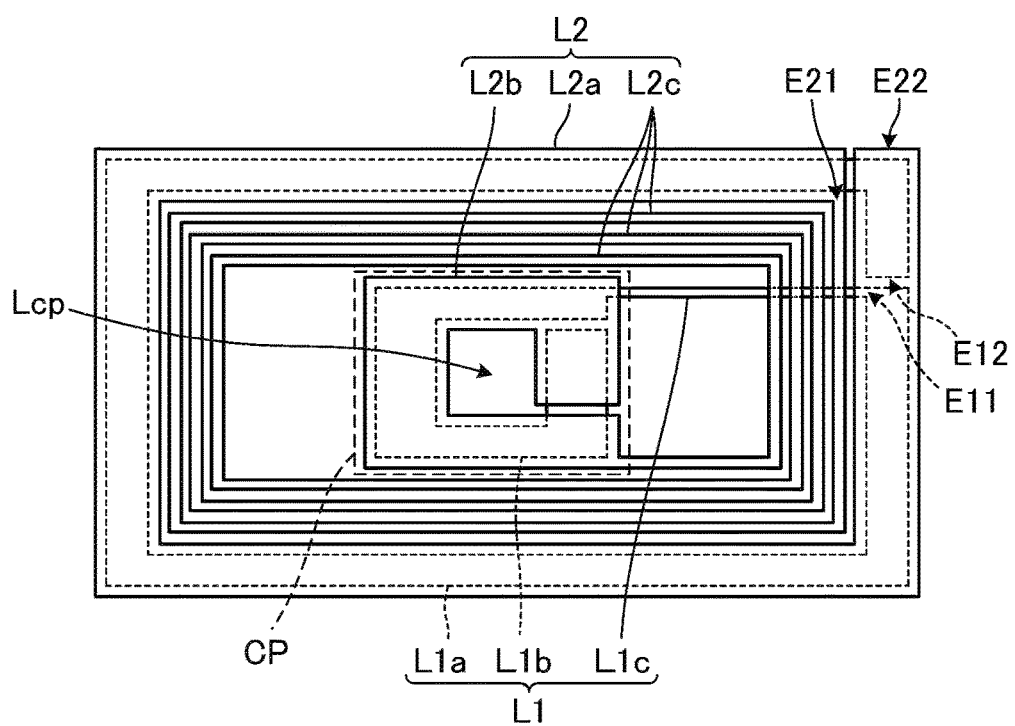
FIG. 15 is a plan view of the antenna device 104.

An antenna device according to a fourth embodiment is described with reference to the drawings. FIG. 14A is an external perspective view of an antenna device 104 according to the fourth embodiment, and FIG. 14B is an exploded perspective view of the antenna device 104. FIG. 15 is a plan view of the antenna device 104. For the purpose of avoiding complication in FIG. 15, a base layer 1 and an RFIC module 10b are omitted.

The antenna device 104 according to the fourth embodiment is different from the antenna device 101 according to the first embodiment in that a second coil conductor L2 includes a second intermediate coil conductor. The RFIC module 10b is different from the RFIC module 10 in that the RFIC module 10b includes a sealing resin 5. Other structures of the antenna device 104 are substantially the same as those of the antenna device 101.

The antenna device 104 includes the base layer 1, a first coil conductor L1, the second coil conductor L2, and the RFIC module 10b.

The first coil conductor L1 is a thin metal plate disposed on (e.g., adhered to) a rear surface of the base layer 1. The first coil conductor L1 includes a first large-diameter loop shaped conductor L1a and a first small-diameter loop shaped conductor L1b. The first large-diameter loop shaped conductor L1a is a thin metal plate that is wound in a loop shaped shape along the peripheral edge of the base layer 1. The first small-diameter loop shaped conductor L1b is a loop shaped thin metal plate having smaller inner and outer diameters than the first large-diameter loop shaped conductor L1a. The first small-diameter loop shaped conductor L1b is disposed in the inside of a coil opening of the first large-diameter loop shaped conductor L1a.

According to the present embodiment, the first small-diameter loop shaped conductor L1b is disposed at the center of the inside of the coil opening of the first large-diameter loop shaped conductor L1a, and thus the winding axis of the first large-diameter loop shaped conductor L1a is aligned with the winding axis of the first small-diameter loop shaped conductor L1b. A first end L11 of the first large-diameter loop shaped conductor L1a is connected via a first connection conductor L1c having a smaller width than the first large-diameter loop shaped conductor L1a and the first small-diameter loop shaped conductor L1b to the first small-diameter loop shaped conductor L1b.

The second coil conductor L2 is a thin metal plate disposed on (e.g., adhered to) a front surface of the base layer 1. The second coil conductor L2 includes a second large-diameter loop shaped conductor L2a, a second small-diameter loop shaped conductor L2b, and a second intermediate coil conductor L2c. The second large-diameter loop shaped conductor L2a is a thin metal plate that is wound in a loop shaped shape along the peripheral edge of the base layer 1. The second intermediate coil conductor L2c is a thin spiral metal plate whose number of windings is approximately 3. The second intermediate coil conductor L2c is disposed in the inside of a coil opening of the second large-diameter loop shaped conductor L2a. The second small-diameter loop shaped conductor L2b is a loop shaped thin metal plate having smaller inner and outer diameters than the second large-diameter loop shaped conductor L2a and the second intermediate coil conductor L2c. The second small-diameter loop shaped conductor L2b is disposed in the inside of a coil opening of the second intermediate coil conductor L2c.

According to the present embodiment, the second small-diameter loop shaped conductor L2b is disposed at the center of the inside of the coil opening of the second intermediate coil conductor L2c, and the second intermediate coil conductor L2c is disposed at the center of the inside of the coil opening of the second large-diameter loop shaped conductor L2a. The winding axis of the second large-diameter loop shaped conductor L2a, the winding axis of the second intermediate coil conductor L2c, and the winding axis of the second small-diameter loop shaped conductor L2b are thus aligned with each other. The second intermediate coil conductor L2c has a smaller width than the second large-diameter loop shaped conductor L2a and the second small-diameter loop shaped conductor L2b. A first end L21 of the second large-diameter loop shaped conductor L2a is connected via the second intermediate coil conductor L2c to the second small-diameter loop shaped conductor L2b. A part of the base layer 1 on which the RFIC module 10b is mounted may be hollowed out and thus the antenna device according to the present embodiment eliminates a protrusion formed by the RFIC module 10b, which is thick. The antenna device according to the present embodiment eliminates the protrusion formed by the thick RFIC module 10b particularly when the base layer 1 is thicker than the RFIC module 10b. It is thus possible to have a flat card with an RFIC module by simply adhering a plate-like sheet to upper and lower surfaces of the antenna device shown in FIGS. 14A and 14B.

Figure 16A:
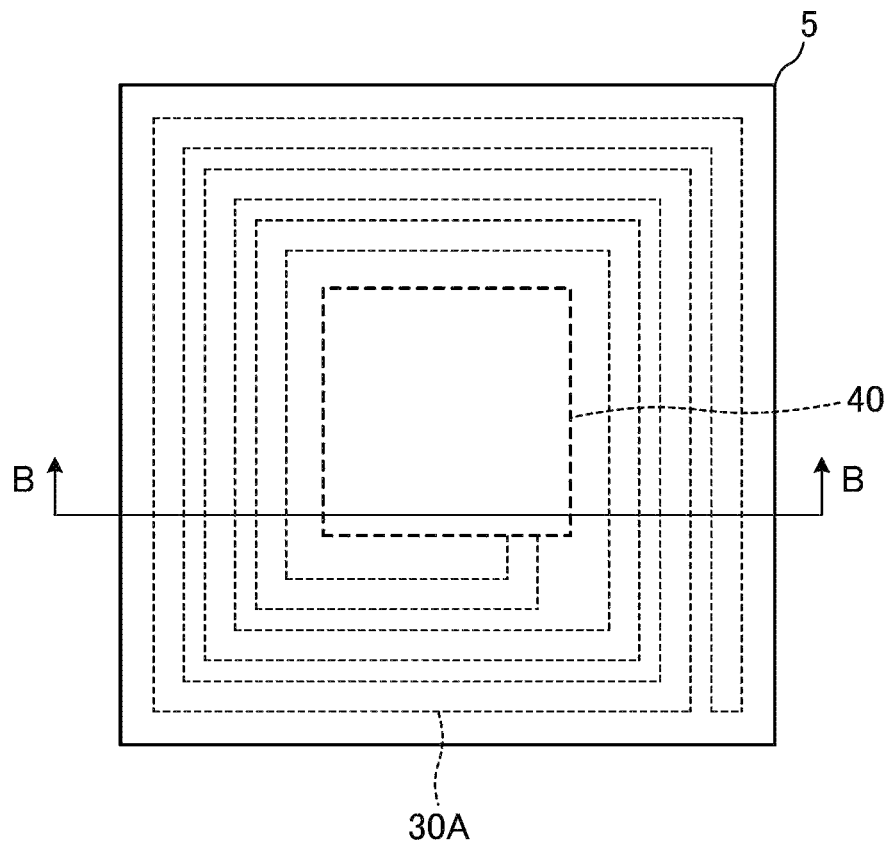
FIG. 16A is a plan view of an RFIC module 10b.
Figure 16B:
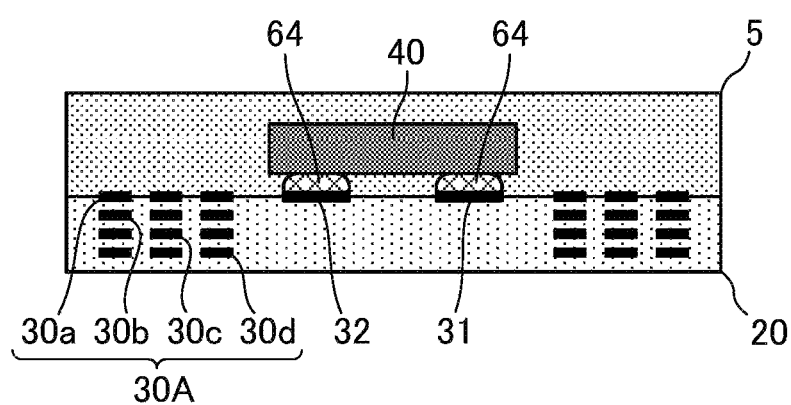
FIG. 16B is a cross-sectional view taken along a line B-B in FIG. 16A.
Figure 17:
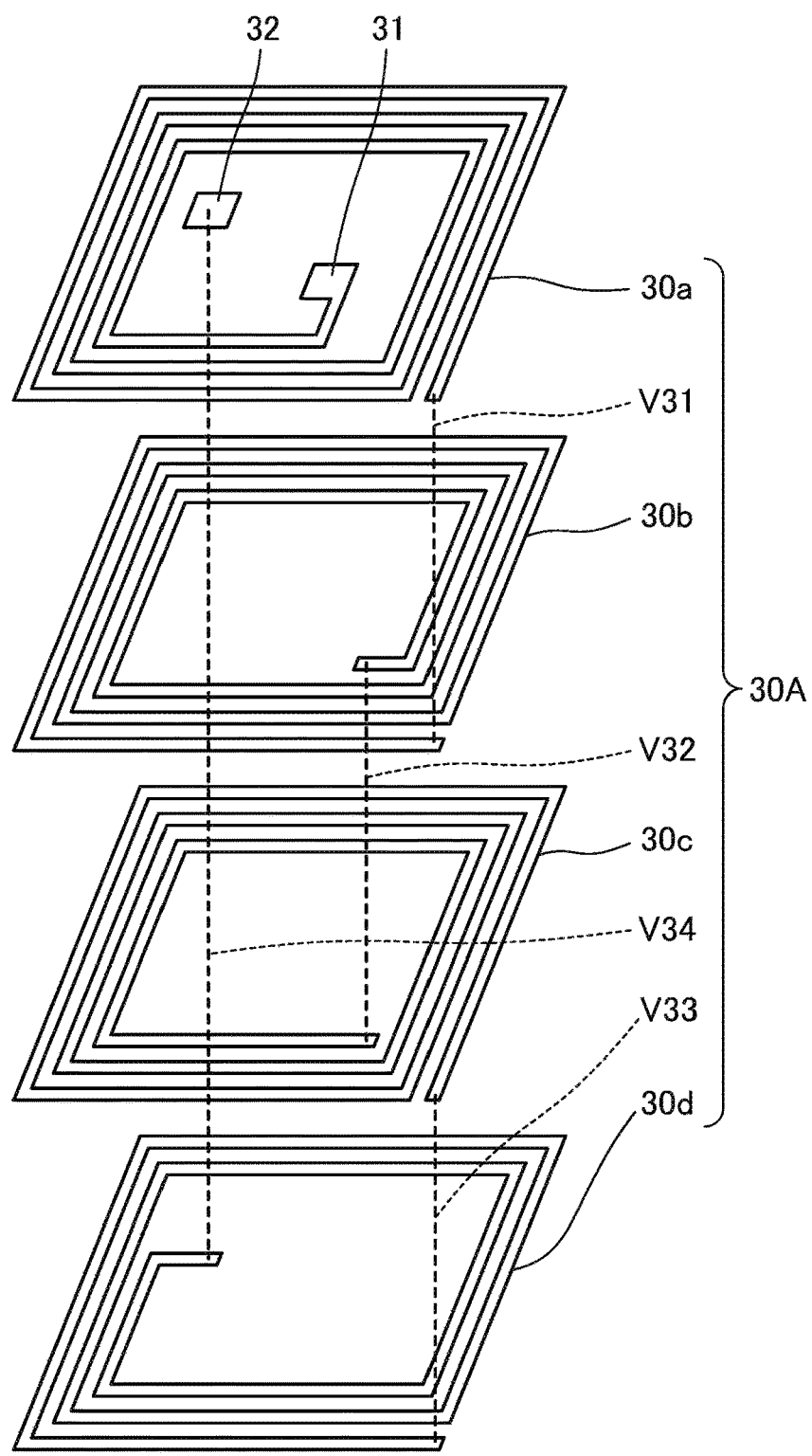
FIG. 17 is a perspective view of a conductor pattern of a power supply coil 30A included in the RFIC module 10b.

The structure of the RFIC module 10b according to the present embodiment is described with reference to the drawings. FIG. 16A is a plan view of the RFIC module 10b, and FIG. 16B is a cross-sectional view taken along a line B-B in FIG. 16A. FIG. 17 is a perspective view of a conductor pattern of a power supply coil 30A included in the RFIC module 10b.

The RFIC module 10b includes an RFIC element 40, a laminate 20, the power supply coil 30A formed in contact with the laminate 20, and the sealing resin 5.

The laminate 20 is a multi-layer board formed by laminating four dielectric sheets. The power supply coil 30A is formed by spiral power supply coil conductors 30a, 30b, 30c, and 30d that are respectively formed on the four dielectric sheets, a first connection electrode 31, a second connection electrode 32, and inter-layer connection conductors V31, V32, V33, and V34.

Specifically, in this aspect, the first connection electrode 31 is connected to a first end of the power supply coil conductor 30a, and a second end of the power supply coil conductor 30a is connected via the inter-layer connection conductor V31 to a first end of the power supply coil conductor 30b. A second end of the power supply coil conductor 30b is connected via the inter-layer connection conductor V32 to a first end of the power supply coil conductor 30c, and a second end of the power supply coil conductor 30c is connected via the inter-layer connection conductor V33 to a first end of the power supply coil conductor 30d. A second end of the power supply coil conductor 30d is connected via the inter-layer connection conductor V34 to the second connection electrode 32.

Each of the first connection electrode 31 and the second connection electrode 32 is connected via a conductive bonding material 64 to the RFIC element 40 as shown in FIG. 16B. The sealing resin 5 is formed on a surface of the laminate 20 having the RFIC element 40 mounted thereon (e.g., an upper surface of the laminate 20 in FIG. 16B). The RFIC element 40 is embedded in the sealing resin 5 as shown in FIG. 16B.

As shown in FIG. 14A, the RFIC module 10b is disposed in a manner that the outline of the power supply coil 30A is inside a coil opening of the first small-diameter loop shaped conductor L1b and a coil opening of the second small-diameter loop shaped conductor L2b in a planar view.

Figure 18:
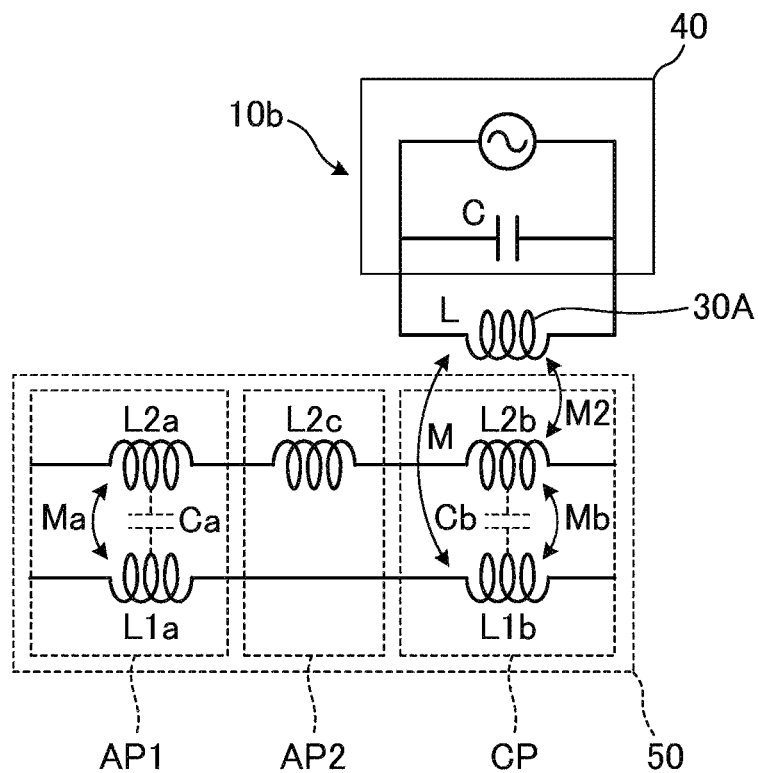
FIG. 18 is an equivalent circuit diagram of the antenna device 104.

FIG. 18 is an equivalent circuit diagram of the antenna device 104.

As shown in FIG. 18, in the first coil conductor L1 and the second coil conductor L2, inductance components of the first coil conductor L1 and the second coil conductor L2 (L1a, L1b, L2a, L2b, and L2c) and capacitive components between the first coil conductor L1 and the second coil conductor L2 (capacities Ca and Cb) form an antenna resonance circuit. The inductance component of the second intermediate coil conductor L2c is larger than inductance components of the second large-diameter loop shaped conductor L2a and the second small-diameter loop shaped conductor L2b.

The present embodiment has the following effects in addition to the operations and effects described in the above embodiments.

The antenna device 104 according to the present embodiment includes the second intermediate coil conductor L2c connected between the second large-diameter loop shaped conductor L2a and the second small-diameter loop shaped conductor L2b. The numbers of windings of the first large-diameter loop shaped conductor L1a and the second large-diameter loop shaped conductor L2a are small and thus the inductance components of the first coil conductor L1 and the second coil conductor L2 forming the antenna resonance circuit tend to be insufficient. However, in the present embodiment, this structure enables an inductance component required for the antenna resonance circuit to be obtained easily.

According to the present embodiment, the second intermediate coil conductor L2c has a smaller width than the second large-diameter loop shaped conductor L2a and the second small-diameter loop shaped conductor L2b. With this structure, it is possible to easily form an intermediate coil conductor whose number of windings is sufficient for obtaining a desired inductance component in the limited space.

In the antenna device 104, the second large-diameter loop shaped conductor L2a has a larger width than the first large-diameter loop shaped conductor L1a disposed to oppose the second large-diameter loop shaped conductor L2a. Even if the positions where the first large-diameter loop shaped conductor L1a and the second large-diameter loop shaped conductor L2a that are disposed to oppose to each other are formed are shifted, it is possible to reduce a variation in the capacity Ca (capacitance) between the first large-diameter loop shaped conductor L1a and the second large-diameter loop shaped conductor L2a. That is, it is possible to reduce a variation in the capacity Ca due to positional shifts of the first large-diameter loop shaped conductor L1a and the second large-diameter loop shaped conductor L2a. Consequently, it is possible to reduce a variation in the resonance frequency of the booster antenna 50 (i.e., the antenna resonance circuit) formed by the first coil conductor L1 and the second coil conductor L2.

In the antenna device 104, the second small-diameter loop shaped conductor L2b has a larger width than the first small-diameter loop shaped conductor L1b disposed to oppose the second small-diameter loop shaped conductor L2b. Even if the positions where the first small-diameter loop shaped conductor L1b and the second small-diameter loop shaped conductor L2b that are disposed to oppose to each other are formed are shifted, it is possible to reduce a variation in the capacity Cb (capacitance) between the first small-diameter loop shaped conductor L1b and the second small-diameter loop shaped conductor L2b. That is, it is possible to reduce a variation in the capacity Cb due to positional shifts of the first small-diameter loop shaped conductor L1b and the second small-diameter loop shaped conductor L2b. Consequently, it is possible to reduce a variation in the resonance frequency of the booster antenna 50 (the antenna resonance circuit) formed by the first coil conductor L1 and the second coil conductor L2.

According to the present embodiment, the first coil conductor L1 does not include an intermediate coil conductor. That is, a conductor surface of the intermediate coil conductor included in the first coil conductor L1 and a conductor surface of the second intermediate coil conductor L2c do not oppose to each other in the antenna device 104. In this structure, the intermediate coil conductors having a smaller width than the large-diameter loop shaped conductor and the small-diameter loop shaped conductor do not oppose to each other, and thus it is possible to reduce a variation in capacity (capacitance) due to positional shifts of the first coil conductor L1 and the second coil conductor L2 disposed to oppose to each other.

While the present embodiment describes a structural example in which the second coil conductor L2 includes an intermediate coil conductor (i.e., the second intermediate coil conductor L2c), the present embodiment is not limited to this example. The first coil conductor L1 may include a first intermediate coil conductor and a first end of the first large-diameter loop shaped conductor L1a may be connected via the first intermediate coil conductor to the first small-diameter loop shaped conductor. Alternatively, both the first coil conductor L1 and the second coil conductor L2 may include an intermediate coil conductor. In such a case, it is preferable that intermediate coil conductors having a smaller width than the large-diameter loop shaped conductor and the small-diameter loop shaped conductor do not oppose to each other.

Other Embodiments

While the above embodiments describe an example in which the first coil conductor and the second coil conductor forming the booster antenna 50 have a rectangular shape in a planar view, the present embodiments are not limited to this example. The first coil conductor and the second coil conductor forming the booster antenna 50 may have a polygonal shape, a circular shape, or an elliptical shape in a planar view, and the shape may be changed appropriately.

While the above embodiments describe an example in which the base layer 1 has a rectangular shape in a planar view, the present disclosure is not limited to this example. The base layer 1 may have a polygonal shape, a circular shape, or an elliptical shape in a planar view, and the shape may be changed appropriately.

While the above embodiments describe an example in which the first large-diameter loop shaped conductor L1*a* and the second large-diameter loop shaped conductor L2*a* substantially circle around the outer periphery of the base layer 1, the present disclosure is not limited to this example. The shape and size of the first large-diameter loop shaped conductor L1*a* and the second large-diameter loop shaped conductor L2*a* relative to the base layer 1 may be changed appropriately.

The protection layer 2 is optional in the antenna device according to the present disclosure. When the antenna device according to the present disclosure does not include the protection layer 2, it is possible to have a flexible and thin antenna device. Additionally, the sealing layer 63 is optional in the antenna device according to the present disclosure. When the antenna device according to the present disclosure does not include the sealing layer 63, it is possible to have a flexible and thin antenna device.

The above embodiments describe an example of the RFIC module 10 in which the RFIC element 40 and the power supply coil 30 are incorporated in one chip, the present disclosure is not limited to this example. Instead of the structure in which the RFIC element 40 is mounted on the laminate 20 having the power supply coil 30, the RFIC element 40 and the power supply coil 30 may be disposed in different positions. For example, the power supply coil 30 may be disposed in the inside Lcp of the coil opening of the small-diameter loop shaped conductor and the RFIC element 40 may be disposed outside the inside Lcp of the coil opening of the small-diameter loop shaped conductor.

While a card device is exemplified as the antenna device according to the present disclosure, the antenna device may be used as an embedded antenna in an electronic device such as a mobile communication terminal.

The invention claimed is:

1. An antenna device comprising:
an RFIC element;
a power supply coil connected to the RFIC element; and
a first coil conductor including a first large-diameter loop shaped conductor and a first small-diameter loop shaped conductor connected to a first end of the first large-diameter loop shaped conductor, the first large-diameter loop shaped conductor having a larger diameter than the first small-diameter loop shaped conductor,
wherein an outer diameter of the power supply coil is disposed within a coil opening of the first small-diameter loop shaped conductor in a planar view of the antenna device, such that the power supply coil is magnetically coupled to the first small-diameter loop shaped conductor, and
wherein the first large-diameter loop shaped conductor and the first small-diameter loop shaped conductor each comprise a single winding.

2. The antenna device according to claim 1, wherein a winding axis direction of the power supply coil is aligned with a winding axis direction of the first small-diameter loop shaped conductor.

3. The antenna device according to claim 1, further comprising:
a second coil conductor including a second large-diameter loop shaped conductor opposing the first large-diameter loop shaped conductor and a second small-diameter loop shaped conductor opposing the first small-diameter loop shaped conductor and connected to a first end of the second large-diameter loop shaped conductor,
wherein the first coil conductor and the second coil conductor form an antenna resonance circuit including inductance components of the first coil conductor and the second coil conductor and a capacitive component between the first coil conductor and the second coil conductor.

4. The antenna device according to claim 3, further comprising:
a base layer, wherein the first coil conductor is a first metal plate fixed to the base layer, and the second coil conductor is a second metal plate fixed to the first coil conductor with an insulating adhesive layer interposed between the first coil conductor and the second coil conductor.

5. The antenna device according to claim 3,
wherein the first small-diameter loop shaped conductor comprises substantially 1 winding and the first small-diameter loop shaped conductor is disposed in a corner area of the first large-diameter loop shaped conductor in a planar view, with a space between the first small-diameter loop shaped conductor and a second end of the first large-diameter loop shaped conductor, and
wherein the second small-diameter loop shaped conductor comprises substantially 1 winding and the second small-diameter loop shaped conductor is disposed in a corner area of the second large-diameter loop shaped conductor in a planar view, with a space between the second small-diameter loop shaped conductor and a second end of the second large-diameter loop shaped conductor.

6. The antenna device according to claim 5, wherein the first large-diameter loop shaped conductor comprises substantially 1 winding and the second large-diameter loop shaped conductor comprises substantially 1 winding.

7. The antenna device according to claim 3,
wherein the first small-diameter loop shaped conductor is wound in the same winding direction as the first large-diameter loop shaped conductor in a planar view of the antenna device, and
wherein the second small-diameter loop shaped conductor is wound in the same winding direction as the second large-diameter loop shaped conductor in the planar view.

8. The antenna device according to claim 1, further comprising an RFIC module that includes the RFIC element and the power supply coil.

9. The antenna device according to claim 8,
wherein the RFIC module includes a laminate formed by laminating a plurality of base material layers, and
wherein the power supply coil is formed in an interior of the laminate and the RFIC element is formed either on a surface of the laminate or in the interior of the laminate.

10. The antenna device according to claim 1,
wherein the first coil conductor includes a first intermediate coil conductor, and
wherein the first small-diameter loop shaped conductor is connected via the first intermediate coil conductor to the first end of the first large-diameter loop shaped conductor.

11. The antenna device according to claim 10, wherein the first intermediate coil conductor has a smaller width than each of the first large-diameter loop shaped conductor and the first small-diameter loop shaped conductor.

12. The antenna device according to claim 3,
wherein the second coil conductor includes a second intermediate coil conductor, and
wherein the second small-diameter loop shaped conductor is connected via the second intermediate coil conductor to the first end of the second large-diameter loop shaped conductor.

13. The antenna device according to claim 12, wherein the second intermediate coil conductor has a smaller width than each of the second large-diameter loop shaped conductor and the second small-diameter loop shaped conductor.

14. The antenna device according to claim 1, further comprising:
a base layer; and
a sealing layer disposed above the base layer with the first coil conductor interposed therebetween,
wherein the sealing layer seals the power supply coil, the RFIC element, and the first coil conductor.

15. The antenna device according to claim 1, wherein a first current flowing in the power supply coil induces a second current that flows in the first small-diameter loop shaped conductor in a direction to cancel out the first current.

16. The antenna device according to claim 3, wherein a total inductance component of the first small-diameter loop shaped conductor and the second small-diameter loop shaped conductor is set to be equal to or less than 1/5 of a total inductance component of the first coil conductor and the second coil conductor.

17. The antenna device according to claim 4, further comprising an RFIC module that includes the RFIC element and the power supply coil, wherein a thickness of the RFIC module is less than a total thickness of the first coil conductor, the second coil conductor and the insulating adhesive layer.

18. The antenna device according to claim 1, wherein the first coil conductor has a rectangular shape in a planar view of the antenna device and the first small-diameter loop shaped conductor is disposed at a corner of the first coil conductor.

19. A method of manufacturing an antenna device, the method comprising:
forming a first coil conductor on a base layer, the first coil conductor including a first large-diameter loop shaped conductor and a first small-diameter loop shaped conductor connected to a first end of the first large-diameter loop shaped conductor, wherein the first large-diameter loop shaped conductor has a larger diameter than the first small-diameter loop shaped conductor and the first large-diameter loop shaped conductor and the first small-diameter loop shaped conductor each comprise a single winding;
punching a metal plate to form a second coil conductor including a second large-diameter loop shaped conductor and a second small-diameter loop shaped conductor connected to a first end of the second large-diameter loop shaped conductor, wherein the second large-diameter loop shaped conductor has a larger diameter than the second small-diameter loop shaped conductor;
fixing the second coil conductor to the first coil conductor with an insulating adhesive layer interposed between the first coil conductor and the second coil conductor, such that the first large-diameter loop shaped conductor opposes the second large-diameter loop shaped conductor and the first small-diameter loop shaped conductor opposes the second small-diameter loop shaped conductor; and
disposing a power supply coil connected to an RFIC element on the base layer within an opening of the first small-diameter loop shaped conductor and a coil opening of the second small-diameter loop shaped conductor.

20. The method according to claim 19, further comprising forming a sealing layer above the base layer, such that the sealing layer seals the power supply coil, the RFIC element, the first coil conductor, the second coil conductor and the insulating adhesive layer.

* * * * *